(12) United States Patent
Kataoka et al.

(10) Patent No.: US 9,965,448 B2
(45) Date of Patent: May 8, 2018

(54) ENCODING METHOD AND INFORMATION PROCESSING DEVICE

(71) Applicant: FUJITSU LIMITED, Kawasaki-shi, Kanagawa (JP)

(72) Inventors: Masahiro Kataoka, Kamakura (JP); Yasuhiro Suzuki, Yokohama (JP); Tatsuhiro Sato, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/209,055

(22) Filed: Jul. 13, 2016

(65) Prior Publication Data
US 2017/0017619 A1    Jan. 19, 2017

(30) Foreign Application Priority Data
Jul. 14, 2015    (JP) .................... 2015-140880

(51) Int. Cl.
G06F 17/00    (2006.01)
G06F 17/22    (2006.01)
H03M 7/30    (2006.01)
G06F 17/27    (2006.01)

(52) U.S. Cl.
CPC ...... *G06F 17/2217* (2013.01); *G06F 17/2205* (2013.01); *G06F 17/2735* (2013.01); *H03M 7/3084* (2013.01); *H03M 7/6052* (2013.01)

(58) Field of Classification Search
CPC .............................................. G06F 17/2217
See application file for complete search history.

(56) References Cited

U.S. PATENT DOCUMENTS

| 4,814,746 A | * | 3/1989 | Miller | .................... G06T 9/005 341/95 |
| 5,579,224 A | * | 11/1996 | Hirakawa | ............. G06F 17/271 704/2 |
| 5,590,317 A | * | 12/1996 | Iguchi | ............... G06F 17/30011 |

(Continued)

FOREIGN PATENT DOCUMENTS

| JP | 5-181641 A | 7/1993 |
| JP | 2000-201080 A | 7/2000 |

OTHER PUBLICATIONS

Extended European Search Report dated Dec. 6, 2016 in Patent Application No. 16179063.9.

(Continued)

Primary Examiner — Laurie A Ries
(74) Attorney, Agent, or Firm — Oblon, McClelland, Maier & Neustadt, L.L.P.

(57) ABSTRACT

A non-transitory computer-readable recording medium stores an encoding program that causes a computer to execute a process. The process includes first encoding a first character string in input data to a first code, when the first character string being registered in a first dictionary, the first code being associated with the first character string in the first dictionary; second encoding a second character string in input data to a second code and registering the second character string to a dynamic dictionary, when the second character string being not registered in the first dictionary, the second code being associated with the second character string and preliminary information in the dynamic dictionary; and generating encoded data including the encoded input data and the dynamic dictionary.

3 Claims, 23 Drawing Sheets

(56) References Cited

U.S. PATENT DOCUMENTS

| | | | | |
|---|---|---|---|---|
| 5,663,721 A * | 9/1997 | Rossi | .................. | H03M 7/3084 |
| | | | | 341/106 |
| 5,825,926 A * | 10/1998 | Tanaka | ..................... | G06K 9/03 |
| | | | | 382/181 |
| 5,872,530 A * | 2/1999 | Domyo | ............... | H03M 7/3088 |
| | | | | 341/106 |
| 5,907,638 A * | 5/1999 | Onodera | ............. | H03M 7/4031 |
| | | | | 382/232 |
| 5,963,893 A * | 10/1999 | Halstead, Jr. | ......... | G06F 17/274 |
| | | | | 704/9 |
| 6,012,062 A * | 1/2000 | Jagadish | ................. | G06T 9/005 |
| 6,047,298 A * | 4/2000 | Morishita | ........... | H03M 7/3084 |
| | | | | 341/106 |
| 6,100,824 A * | 8/2000 | MacLeod | ............ | H03M 7/3088 |
| | | | | 341/106 |
| 6,215,906 B1 * | 4/2001 | Okada | ..................... | G06T 9/005 |
| | | | | 382/239 |
| 6,502,064 B1 * | 12/2002 | Miyahira | ............ | G06F 17/2735 |
| | | | | 341/106 |
| 6,834,283 B1 * | 12/2004 | Satoh | ...................... | H03M 7/30 |
| 7,026,962 B1 * | 4/2006 | Emami | ............... | H03M 7/3088 |
| | | | | 341/106 |
| 9,087,038 B1 * | 7/2015 | Haldar | .................... | H04W 4/18 |
| 2002/0152219 A1 * | 10/2002 | Singh | ................ | G06F 17/30097 |

OTHER PUBLICATIONS

Salomon David, "Data Compression: The Complete Reference", Print ISBN: 978-0-387-98280-9, XP002150106, Jan. 1, 1998, pp. 101-162 and 357-360.

* cited by examiner

FIG.4A

| 2-GRAM | BIT MAP<br>12_23_34_45_56 | POINTER<br>(2) (3) (4) (5) TO (9) |
|---|---|---|
| aa | 0__0__0__0__0 | |
| ab | 1__0__0__0__0 | |
| ac | 1__0__0__0__0 | |
| ... | | |
| bl | 0__1__0__0__0 | |
| bo | 0__1__0__0__0 | |
| ct | 0__1__0__0__0 | |
| e△ | 0__0__0__1__1 | |
| le | 0__0__1__0__0 | |
| ou | 0__0__1__0__0 | |
| ov | 0__0__1__0__0 | |
| t△ | 0__0__1__0__1 | |
| ut | 0__0__0__1__0 | |
| ve | 0__0__0__1__0 | |
| ... | | |
| zz | 0__0__0__0__0 | |
| z△ | 0__0__0__0__0 | |
| ... | | |

| BASIC WORD | LENGTH OF CHARACTER STRING | NUMBER OF TIMES OF APPEARANCE | CODE LENGTH | STATIC CODE | DYNAMIC CODE | BASIC CODE |
|---|---|---|---|---|---|---|
| a | 1 | 9738 | 16 | 4000h | | A00001h |
| ... | | | | | | |
| able | 5 | 785 | 16 | 4005h | | A00007h |
| ... | | | | | | |
| about | 6 | 539 | 16 | 4028h | | A00035h |
| above | 6 | | 16 | 402Eh | | A0003Fh |
| ... | | | | | | |
| act | 3 | | 16 | 4041h | | A0015Fh |
| ... | | | | | | |
| as | 2 | 4832 | 16 | 4081h | | A0028Fh |
| ... | | | | | | |

| LEAF 2-GRAM | BIT MAP 12_23_34_45... | POINTER TOWARD EACH WORD (2)(3)(4) TO (9) | ENGLISH WORD | LENGTH OF CHARACTER STRING | BRANCH APPEARANCE FREQUENCY | CODE LENGTH | STATIC CODE | DYNAMIC CODE | ROOT BASIC CODE |
|---|---|---|---|---|---|---|---|---|---|
| aa | 0_0_0_0_0 | | | | | | | | |
| ab | 1_0_0_0_0 | | a | 1 | 9738 | 16 | 4000h | | A00001h |
| ac | 1_0_0_0_0 | | ... | | | | | | |
| ... | | | able | 5 | 785 | 16 | 4005h | | A00007h |
| a△ | | | abject | 6 | 17 | | | | A0002Ch |
| ... | | | ... | | | | | | |
| bl | 0_1_0_0_0 | | | | | | | | |
| bo | 0_1_0_0_0 | | about | 6 | 539 | 16 | 4028h | | A00035h |
| ct | 0_0_0_1_1 | | above | 6 | | 16 | 402Eh | | A0003Fh |
| e△ | 0_0_1_0_0 | | ... | | | | | | |
| le | 0_0_1_0_0 | | act | 3 | | 16 | 4041h | | A0015h |
| ou | 0_0_1_0_0 | | ... | | | | | | |
| ov | 0_0_1_0_0 | | as | 2 | 4832 | 16 | 4081h | | A0028Fh |
| t△ | 0_0_1_0_1 | | | | | | | | |
| ut | 0_0_0_1_0 | | | | | | | | |
| ve | 0_0_1_0_0 | | | | | | | | |
| ... | | | | | | | | | |
| zz | 0_0_0_0_0 | | | | | | | | |
| z△ | 0_0_0_0_0 | | | | | | | | |

| 2-GRAM | BIT MAP 12_23_34... | POINTER (2) (3) (4) TO (9) |
|---|---|---|
| aa | 0_0_0_ | |
| ab | 1_0_0_ | |
| ac | 1_0_0_ | |
| ... | | |
| a△ | 1_0_0_ | |
| ... | | |
| zz | 0_0_0_ | |
| z△ | 0_0_0_ | |

| DYNAMIC CODE | CLASSIFI-CATION | POINTER | LENGTH | PRELIMI-NARY CODE |
|---|---|---|---|---|
| A000h | 1 | | 3 | 000000h |
| A001h | 2 | | 6 | 000000h |
| A002h | | | | |
| ... | | | | |
| DFFFh | | | | |
| E00000h | | | | |
| ... | | | | |
| EFFFFFh | | | | |

31B

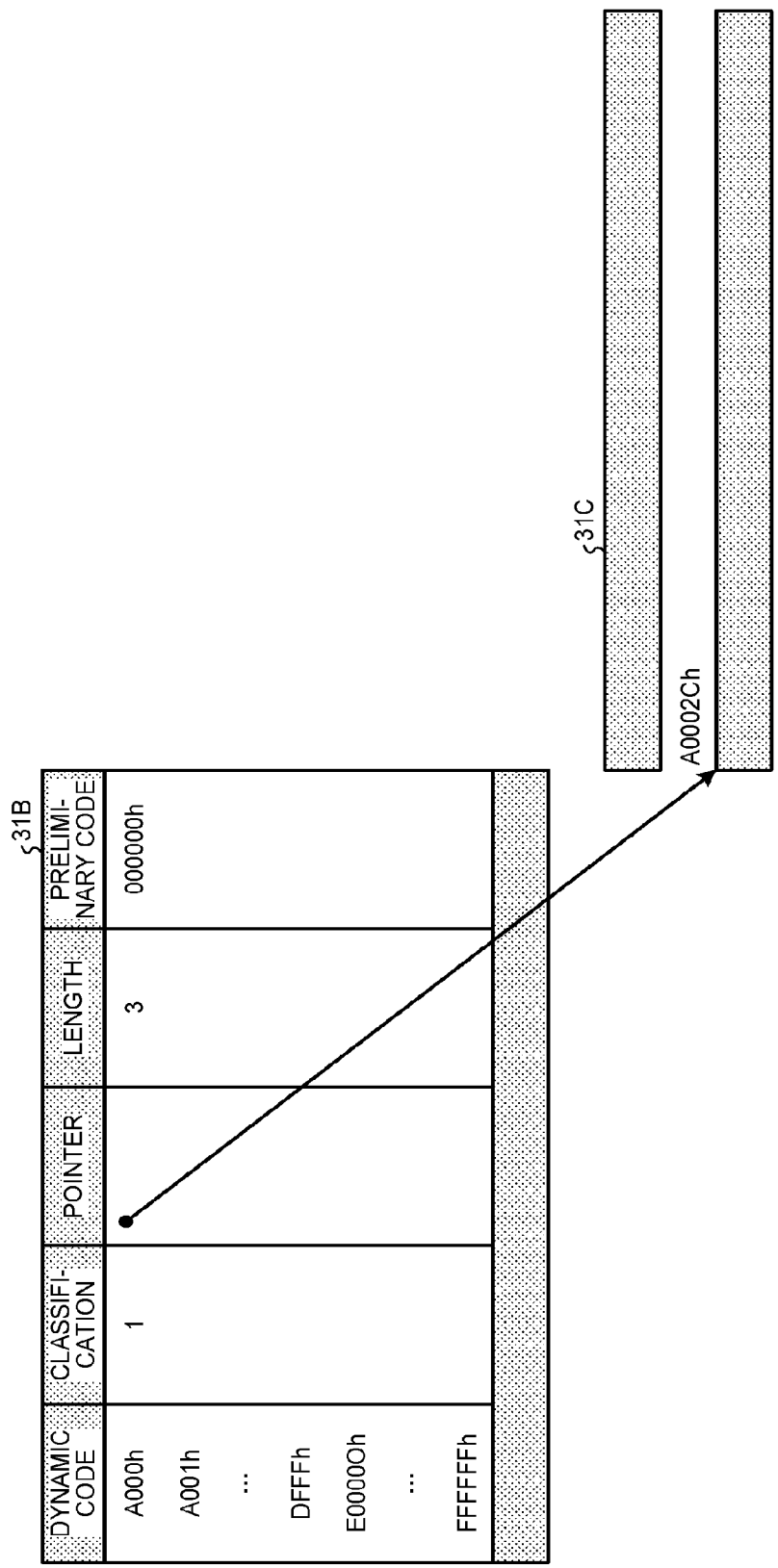

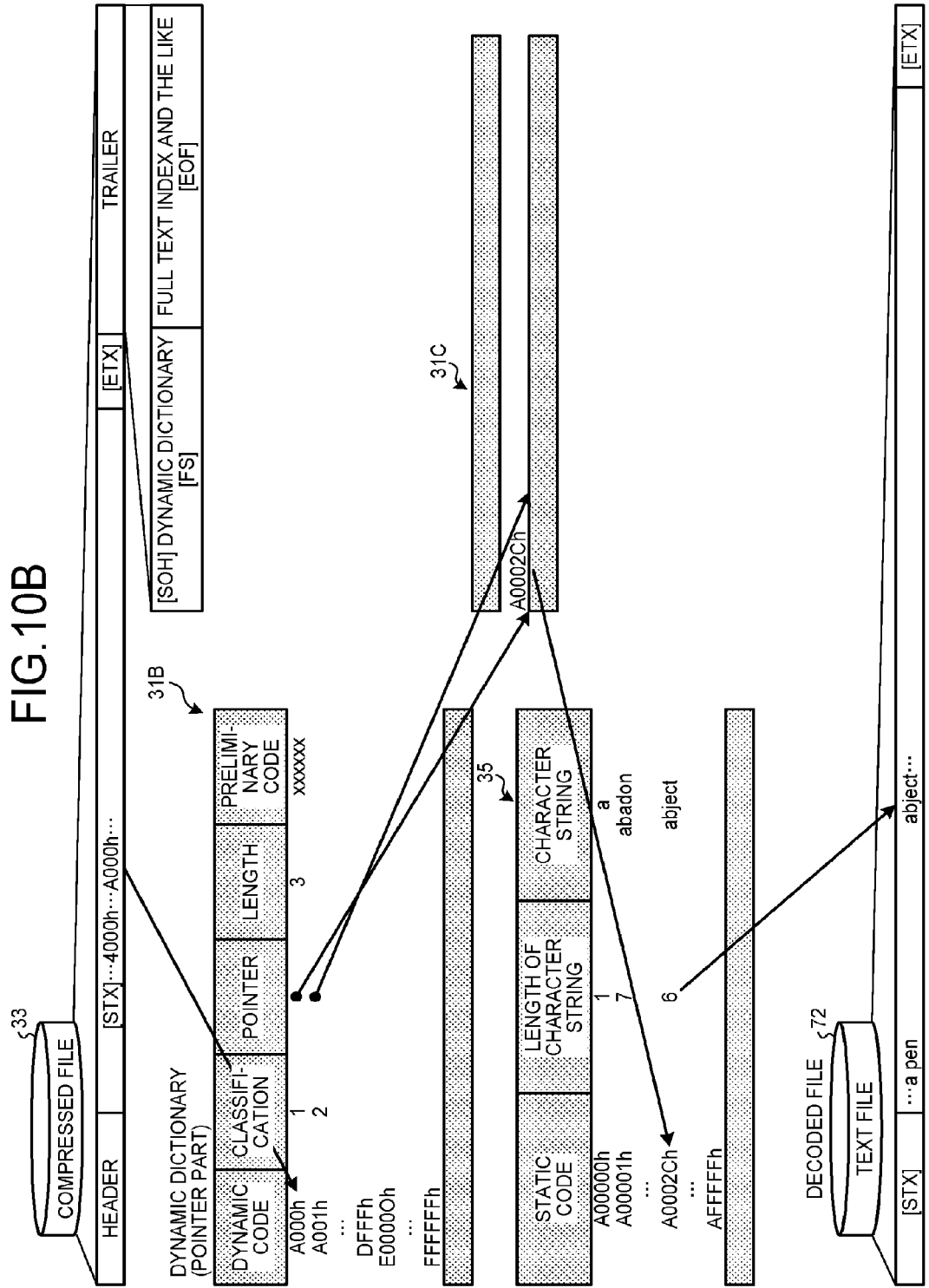

ENCODING METHOD AND INFORMATION PROCESSING DEVICE

CROSS-REFERENCE TO RELATED APPLICATIONS

This application is based upon and claims the benefit of priority of the prior Japanese Patent Application No. 2015-140880, filed on Jul. 14, 2015, the entire contents of which are incorporated herein by reference.

FIELD

The embodiments discussed herein are related to a encoding program, a encoding method, an information processing device, a replacement program, and a replacement method.

BACKGROUND

Known is a technique for compressing (encoding) text data using a dictionary. For example, a word matching with a dictionary included in a computer that performs compression processing is replaced with a previously associated code in the dictionary. Conventional technologies are described in Japanese Laid-open Patent Publication No. 5-181641 and Japanese Laid-open Patent Publication No. 2000-201080, for example.

The number of words held in a dictionary included in a computer that performs compression processing is limited, so that a word not registered in the dictionary may appear in text data as a compression target. The number of held words may be different depending on a scale of the computer. For example, a dictionary having a small amount of data is used in a terminal device such as a cellular telephone and a smartphone to suppress a storage capacity to be used. On the other hand, a large-scale dictionary holding various pieces of information is used in a server computer such as a cloud system to perform data mining, for example. In this way, the number of words held in the dictionary may be different between the terminal device and the cloud system.

Expansion processing for compressed data on which compression processing is performed is not necessarily performed by the same computer as the computer that has performed the compression processing. Thus, the dictionary used for compression processing is limited to a dictionary that can be utilized in any computer that can perform expansion processing. For example, when compressing data to be also expandable by the terminal device, the cloud system compresses the data using a dictionary that can be utilized in the terminal device even when a large-scale dictionary can be utilized. Due to this, the compressed data can be expanded by the terminal device. However, such compressed data is not effectively utilized in other computers including the large-scale dictionary.

SUMMARY

According to an aspect of an embodiment, a non-transitory computer-readable recording medium stores an encoding program that causes a computer to execute a process. The process includes first encoding a first character string in input data to a first code, when the first character string being registered in a first dictionary, the first code being associated with the first character string in the first dictionary; second encoding a second character string in input data to a second code and registering the second character string to a dynamic dictionary, when the second character string being not registered in the first dictionary, the second code being associated with the second character string and preliminary information in the dynamic dictionary; and generating encoded data including the encoded input data and the dynamic dictionary.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4A is a diagram illustrating an example of a data configuration of a bit filter part of a static dictionary;

FIG. 4B is a diagram illustrating an example of a data configuration of a dictionary part of the static dictionary;

FIG. 4C is a diagram conceptually illustrating a data configuration of the static dictionary;

FIG. 6A is a diagram illustrating an example of a data configuration of a dynamic bit filter part of a dynamic dictionary;

FIG. 6B is a diagram illustrating an example of a data configuration of a pointer part of the dynamic dictionary;

FIG. 7A is a diagram illustrating an example of a state in which a compressed code dynamically assigned to a low frequency word is registered in the dynamic dictionary;

FIG. 10B is a diagram schematically illustrating a procedure for decoding the low frequency word;

DESCRIPTION OF EMBODIMENTS

Preferred embodiments of the present invention will be explained with reference to accompanying drawings. The scope of the invention is not limited by the embodiments. The embodiments can be appropriately combined without causing contradiction in processing content.

[a] First Embodiment

Compression (Encoding) Processing

Figure 1:
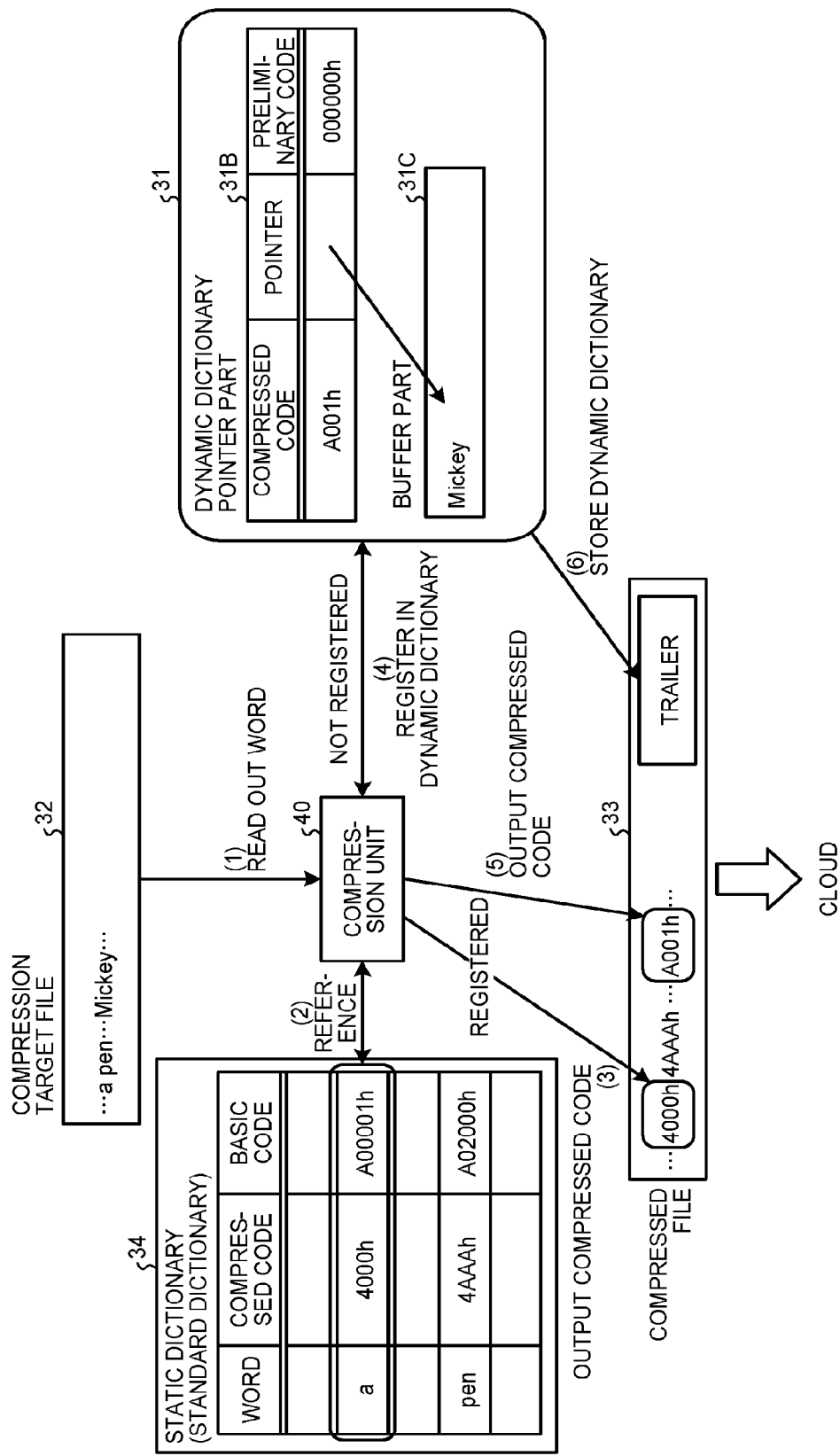
FIG. 1 is a diagram schematically illustrating a procedure of compression processing.

First, the following schematically describes compression processing with reference to FIG. 1. FIG. 1 is a diagram schematically illustrating a procedure of compression processing. The following exemplifies a case in which a terminal device 10 such as a cellular telephone or a smartphone compresses (encodes) " . . . a pen . . . Mickey . . . " included in a compression target file 32 as a target of compression processing.

To compress the compression target file 32, a compression unit 40 of the terminal device 10 reads out each word from a document included in the compression target file 32 in units of a word (FIG. 1 (1)). In the example of FIG. 1, the compression unit 40 reads out "a", "pen", and "Mickey". The compression unit 40 then collates the acquired word with a static dictionary 34 (FIG. 1 (2))

The static dictionary 34 is a dictionary for compression storing a compressed code for each word. A specific configuration of the static dictionary 34 will be described later. In the static dictionary 34, the compressed code is registered for a high frequency word the appearance frequency of which is high. For example, general words such as an article, a verb, and a noun having high appearance frequency in a general sentence are registered as high frequency words in the static dictionary 34. Technical terms and proper nouns such as a place name and a name are regarded as unknown words having low appearance frequency, and not registered in the static dictionary 34. In the example of FIG. 1, "a" and "pen" are regarded as the high frequency words, and "Mickey" is regarded as the unknown word. In the static dictionary 34, a unique basic code for identifying a word is defined for the registered word, and a compressed code is registered for the high frequency word. In the static dictionary 34, basic codes and compressed codes for "a" and "pen" are registered, and a basic code and a compressed code for "Mickey" are not registered. For example, in the static dictionary 34, the basic code "A00001h" and the compressed code "4000h" are registered corresponding to "a", and the basic code "A02000h" and the compressed code "4AAAh" are registered corresponding to "pen". The sign "h" attached to each end of the basic code and the compressed code indicates that the code is represented by hexadecimal numbers.

As a result of collation, if the compressed code corresponding to the collated word is registered in the static dictionary 34, the compression unit 40 acquires the compressed code for the collated word from the static dictionary 34. The compression unit 40 then converts the collated word into the compressed code and outputs the compressed code to a compressed file 33 (FIG. 1 (3)). In the example of FIG. 1, "a" is registered in the static dictionary 34. The compression unit 40 converts "a" into the compressed code "4000h" and outputs the compressed code to the compressed file 33.

As a result of collation, if the compressed code corresponding to the collated word is not registered in the static dictionary 34, the compression unit 40 assigns a new compressed code to the collated word. The compression unit 40 registers the collated word, the assigned new compressed code, and a preliminary code in a dynamic dictionary 31 (FIG. 1 (4)). The dynamic dictionary 31 includes a pointer part 31B and a buffer part 31C. A specific configuration of the dynamic dictionary 31 will be described later. The pointer part 31B includes a region of "compressed code" in which the compressed code is stored, a region of "pointer" in which the pointer is stored, and a region of "preliminary code" in which the preliminary code is stored. The registered word is stored in the buffer part 31C. The assigned new compressed code is stored in the region of "compressed code" of the pointer part 31B. The preliminary code is stored in the region of "preliminary code". A pointer indicating a storing position of the word in the buffer part 31C is stored in the region of "pointer". In the example of FIG. 1, the compression unit 40 assigns the compressed code "A001h" to "Mickey". The compression unit 40 stores "Mickey" in the buffer part 31C. The compression unit 40 stores "A001h" in the region of "compressed code" of the pointer part 31B, stores the pointer indicating the storing position of "Mickey" in the buffer part 31C in the region of "pointer", and stores "000000h" indicating that the preliminary code is not set yet in the region of "preliminary code". The compression unit 40 then converts the collated word into the assigned compressed code and outputs the compressed code to the compressed file 33 (FIG. 1 (5)). In the example of FIG. 1, "Mickey" is converted into the compressed code "A001h" and outputs the compressed code to the compressed file 33.

After completing compression of the document included in the compression target file 32 in units of a word, the compression unit 40 stores the dynamic dictionary 31 in a trailer of the compressed file 33 (FIG. 1 (6)).

Replacement Processing

Figure 2:
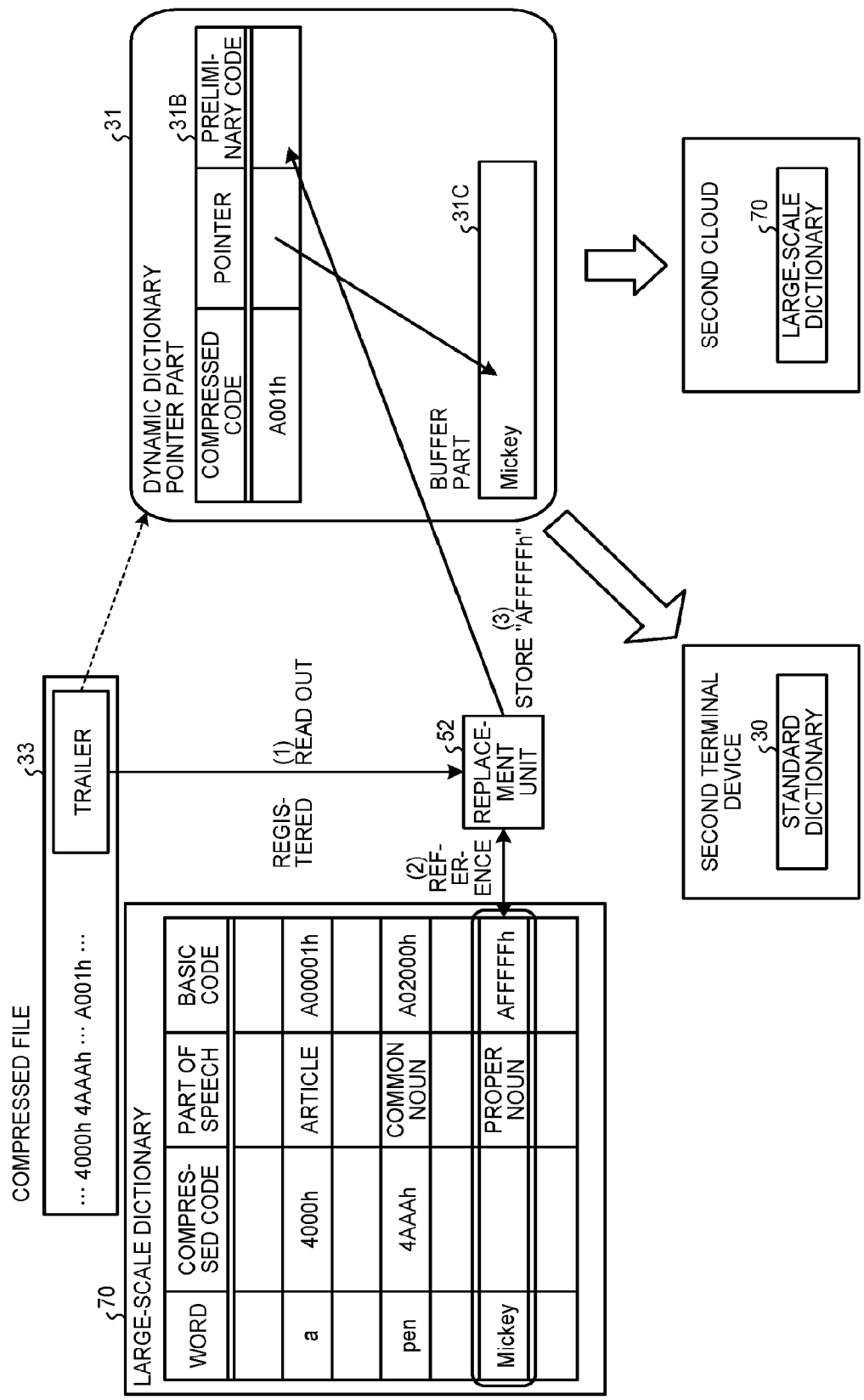
FIG. 2 is a diagram schematically illustrating a procedure of replacement retrieval.

Next, the following schematically describes replacement processing with reference to FIG. 2. FIG. 2 is a diagram schematically illustrating a procedure of replacement retrieval. The following exemplifies a case in which a server device 11 in a cloud system and the like performs replacement of the preliminary code on the received compressed file 33.

The server device 11 stores a large-scale dictionary 70 in which the compressed code for each word is stored. In the large-scale dictionary 70, various pieces of information are registered for a larger number of words than that in the static dictionary 34 illustrated in FIG. 1. For example, in the large-scale dictionary 70, the basic codes are defined for a larger number of words than that in the static dictionary 34 illustrated in FIG. 1, and compressed codes are registered for high frequency words. In the large-scale dictionary 70, a part of speech of each word is registered. The large-scale dictionary 70 may be one dictionary, or may include a plurality of dictionaries. For example, the large-scale dictionary 70 includes a plurality of dictionaries including the static dictionary 34. In the large-scale dictionary 70, the basic code "A00001h", the compressed code "4000h", and the part of speech "article" are registered corresponding to "a". In the large-scale dictionary 70, "A02000h", the compressed code "4AAAh", and the part of speech "common noun" are registered corresponding to "pen". In the large-scale dictionary 70, the basic code "AFFFFFh" and the part of speech "proper noun" are registered corresponding to "Mickey".

In the example of FIG. 2, a replacement unit 52 of the server device 11 reads out the dynamic dictionary 31 from the trailer of the compressed file 33 (FIG. 2 (1)). The replacement unit 52 refers to the word registered in the dynamic dictionary 31, and determines whether the word registered in the dynamic dictionary 31 is registered in the large-scale dictionary 70 (FIG. 2 (2)). If a word registered in the dynamic dictionary 31 is registered in the large-scale dictionary 70, the replacement unit 52 replaces the preliminary code corresponding to the word in the dynamic dictionary 31 with the basic code corresponding to the word in the large-scale dictionary 70 (FIG. 2 (3)). In the example of FIG. 2, "AFFFFFh" is registered corresponding to "Mickey" in the large-scale dictionary 70. The replacement unit 52 replaces a preliminary code region corresponding to the compressed code "A001h" of "Mickey" with "AFFFFFh".

Accordingly, in the server device 11, the unknown word included in the compressed file 33 can be associated with the large-scale dictionary 70 while keeping a state in which the compressed file 33 is compressed, and the server device 11 can specify what is the unknown word or specify the part of speech of the word. The server device 11 can perform various types of processing such as data mining on the compressed data compressed into the compressed file 33 including the unknown word, and can cause the compressed data compressed into the compressed file 33 to be utilized more effectively. An unregistered character string is registered in the compressed file 33, so that the compressed file 33 can be decoded by a second terminal device including only a standard dictionary 30. By replacing the preliminary code corresponding to the word in the dynamic dictionary 31 with the basic code corresponding to the word in the large-scale dictionary 70, a second cloud system including the large-scale dictionary 70 can associate the unknown word included in the compressed file 33 with the large-scale dictionary 70, and can perform various types of processing such as data mining including the unknown word.

Device Configuration

Figure 3:
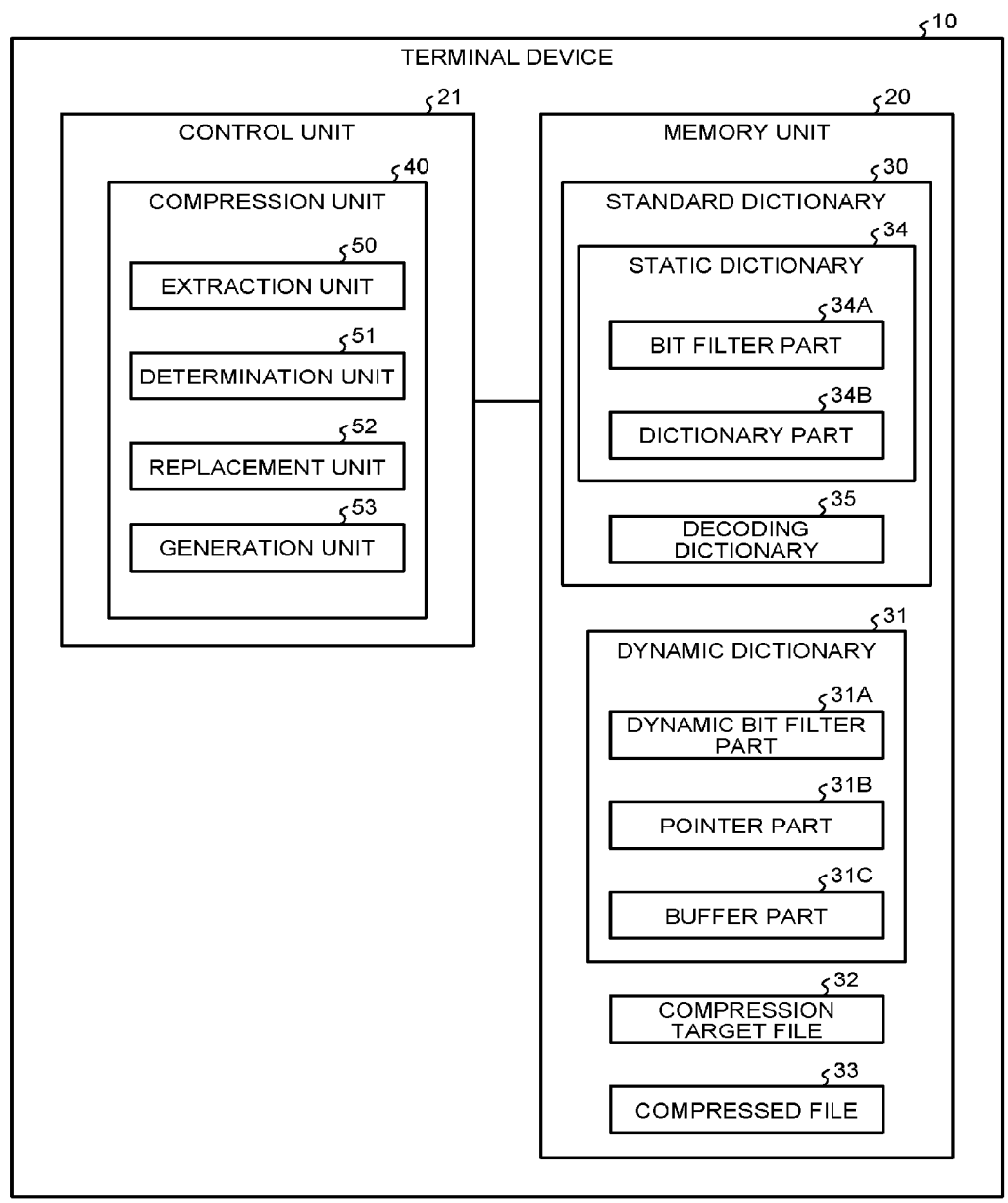
FIG. 3 is a diagram illustrating an example of a configuration of a terminal device.

The following describes a configuration of each device. First, the configuration of the terminal device 10 will be described. FIG. 3 is a diagram illustrating an example of the configuration of the terminal device. The terminal device 10 is a device that performs coding such as compression of the compression target file 32. The terminal device 10 is an information processing device such as a cellular telephone, a smartphone, a tablet terminal, and a personal computer. As illustrated in FIG. 3, the terminal device 10 includes a memory unit 20 and a control unit 21. The terminal device 10 may include units other than the above-described units included in the information processing device.

The memory unit 20 is a storage device such as a hard disk, a solid state drive (SSD), and an optical disc. The memory unit 20 may be a data-rewritable semiconductor memory such as a random access memory (RAM), a flash memory, and a non volatile static random access memory (NVSRAM).

The memory unit 20 stores an operating system (OS) and various programs to be executed by the control unit 21. For example, the memory unit 20 stores a computer program for performing compression processing described later. The memory unit 20 further stores various pieces of data used in the program executed by the control unit 21. For example, the memory unit 20 stores the standard dictionary 30, the dynamic dictionary 31, the compression target file 32, and the compressed file 33.

The standard dictionary 30 is dictionary data used for compressing and decoding data. The standard dictionary 30 includes the static dictionary 34 and a decoding dictionary 35.

The static dictionary 34 is data holding conversion information for associating a word with a compressed code. The static dictionary 34 is used for compressing data. The static dictionary 34 includes a bit filter part 34A and a dictionary part 34B.

The following describes a data configuration of the static dictionary 34 with reference to FIGS. 4A to 4C. FIG. 4A is a diagram illustrating an example of the data configuration of the bit filter part of the static dictionary. The bit filter part 34A includes items of "2-gram", "bit map", and "pointer".

The item of "2-gram" is a region for storing a 2-gram character included in each word. For example, as illustrated in FIG. 4A, "able" includes 2-gram characters corresponding to "ab", "bl", and "le". The item of "bit map" is a region for storing a bit string that represents a position at which the 2-gram character is included in the word. For example, when the bit map of 2-gram "ab" is "1_0_0_0_0", the bit map represents that the first two characters of the word are "ab". The item of "pointer" is a region for storing the pointer indicating the storing position in the dictionary part 34B at which the word corresponding to the bit map is stored. The bit map is associated with each word by the pointer.

FIG. 4B is a diagram illustrating an example of the data configuration of the dictionary part of the static dictionary. The dictionary part 34B includes items of "basic word", "length of character string", "number of times of appearance", "code length", "static code", "dynamic code", and "basic code".

The item of "basic word" is a region for storing a word registered in advance as a basic word. For example, in the dictionary part 34B of the static dictionary 34 illustrated in FIG. 4B, each word extracted from a certain population is registered as the basic word. For example, about 190,000 words registered in a dictionary and the like are registered as basic words. The item of "length of character string" is a region for storing the number of bytes representing a length of a character string of the word registered in advance as the basic word. The item of "number of times of appearance" is a region for storing the number of times of appearance of the word in the certain population. The item of "code length" is a region for storing the number of bits representing a length of the compressed code assigned to the word. The item of "static code" is a region for storing the compressed code assigned to the word in advance.

In the present embodiment, the basic words to be registered in the dictionary part 34B of the static dictionary 34 are divided into high frequency words having relatively high appearance frequency and low frequency words having relatively low appearance frequency. In the present embodiment, the 1st to 8192nd basic words are assumed to be the high frequency words, and the 8193rd and subsequent basic words are assumed to be the low frequency words in descending order of appearance frequency. To the high frequency word, a short compressed code is assigned in advance, and the assigned compressed code is stored in the item of "static code" in advance. To the low frequency word, the compressed code is dynamically assigned when the low frequency word appears, and the assigned compressed code is stored in the item of "dynamic code" in advance. For example, to the high frequency word, a 2-byte (16-bit) compressed code is assigned in advance, and the assigned compressed code is stored in the item of "static code" in advance. To the low frequency word, a 3-byte (24-bit) compressed code is dynamically assigned when the low frequency word appears, and the assigned compressed code is stored in the item of "dynamic code" in advance. That is, the compressed code is registered in advance for the high frequency word, and is not registered for the low frequency word in an initial state.

FIG. 4C is a diagram conceptually illustrating the data configuration of the static dictionary. In the static dictionary 34, the bit filter part 34A and the dictionary part 34B are associated with each other via the pointer. The static dictionary 34 can be illustrated to have the data configuration in FIG. 4C.

Returning to FIG. 3, the decoding dictionary 35 is data holding conversion information for associating a word with a compressed code. The decoding dictionary 35 is used for decoding the compressed data.

Figure 5:
FIG. 5 is a diagram illustrating an example of a data configuration of a decoding dictionary.

FIG. 5 is a diagram illustrating an example of the data configuration of the decoding dictionary. The decoding dictionary 35 includes items of "static code", "length of character string", and "character string".

The item of "static code" is a region for storing the compressed code assigned to the word in advance. The item of "length of character string" is a region for storing the length of the character string of the word corresponding to the compressed code. The item of "character string" is a region for storing the character string of the word corresponding to the compressed code. In the decoding dictionary 35, regarding the high frequency word, the assigned compressed code is stored in the item of "static code", the length of the character string of the word is stored in the item of "length of character string", and the character string of the word is stored in the item of "character string". In the decoding dictionary 35, regarding the low frequency word, the basic code is stored in the item of "static code", the length of the character string of the word is stored in the item of "length of character string", and the character string of the word is stored in the item of "character string".

Returning to FIG. 3, the dynamic dictionary 31 is data holding various pieces of information related to the dynamically assigned compressed code. In the present embodiment, the compressed code is dynamically assigned to each of the low frequency word having low appearance frequency and the unknown word such as a word and a character string not included in the basic words among the basic words registered in the static dictionary 34. The dynamic dictionary 31 stores the compressed codes dynamically assigned to the words such as the low frequency word and the unknown word. The dynamic dictionary 31 includes a dynamic bit filter part 31A, a pointer part 31B, and a buffer part 31C.

Figure 6C:
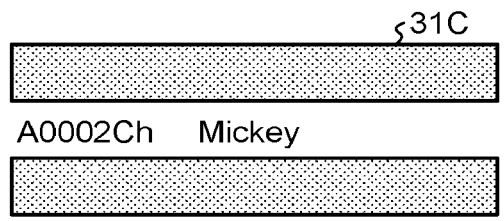
FIG. 6C is a diagram illustrating an example of a data configuration of a buffer part of the dynamic dictionary.

The following describes a data configuration of the dynamic dictionary 31 with reference to FIGS. 6A to 6C. FIG. 6A is a diagram illustrating an example of the data configuration of the dynamic bit filter part of the dynamic dictionary. The dynamic bit filter part 31A includes items of "2-gram", "bit map", and "pointer".

The item of "2-gram" is a region for storing a 2-gram character included in the word. The item of "bit map" is a region for storing a bit string that represents a position at which the 2-gram character is included in the word. The item of "pointer" is a region for storing the pointer indicating the storing position in the pointer part 31B at which the compressed code assigned to the word corresponding to the bit map is stored. The word is associated with each compressed code by the pointer.

FIG. 6B is a diagram illustrating an example of the data configuration of the pointer part of the dynamic dictionary. The pointer part 31B includes items of "dynamic code", "classification", "pointer", "length", and "preliminary code".

The item of "dynamic code" is a region for storing the dynamically assigned compressed code. The item of "classification" is a region for storing a classification of the word to which the compressed code is assigned. In the present embodiment, the classification "1" is assumed to be the low frequency word, and the classification "2" is assumed to be the unknown word. In the item of "classification", "1" is stored when the word to which the compressed code is assigned is the low frequency word, and "2" is stored when the word to which the compressed code is assigned is the unknown word. The item of "pointer" is a region for storing the pointer indicating the storing position in the buffer part 31C at which the word to which the compressed code is assigned is stored. The compressed code is associated with each word to which the compressed code is assigned by the pointer. The item of "length" is a region for storing the length of the word to which the compressed code is assigned. The item of "preliminary code" is a region for storing the preliminary code to be associated with the word to which the compressed code is assigned. In the present embodiment, the item of "preliminary code" is provided to the dynamic dictionary 31 to enable the preliminary code to be associated with the compressed code.

FIG. 6C is a diagram illustrating an example of a data configuration of the buffer part of the dynamic dictionary. The buffer part 31C stores information related to the word to which the compressed code is dynamically assigned. For example, when the word to which the compressed code is dynamically assigned is the low frequency word, the basic code of the word is stored in the buffer part 31C. When the word to which the compressed code is dynamically assigned is the unknown word, the character string of the unknown word is stored in the buffer part 31C.

The following describes an example of a state in which a compressed code dynamically assigned to a word is registered in the dynamic dictionary 31. FIG. 7A is a diagram illustrating an example of the state in which a compressed code dynamically assigned to a low frequency word is registered in the dynamic dictionary. The example of FIG. 7A indicates a state in which the compressed code "A000h" that is dynamically assigned to the word "Abject" is registered, the basic code of the word "Abject" being "A0002Ch" illustrated in FIG. 4C. The basic code "A0002Ch" is registered in the buffer part 31C. In the pointer part 31B, the assigned compressed code "A000h" is registered in the item of "dynamic code", the classification "1" is registered in the item of "classification", and the pointer indicating the position of the basic code "A0002Ch" is registered in the item of "pointer". In the pointer part 31B, the length "3"-byte of the basic code "A0002Ch" is registered in the item of "length", and an initial value "000000h" indicating that the preliminary code is not registered is registered in the item of "preliminary code".

Figure 7B:
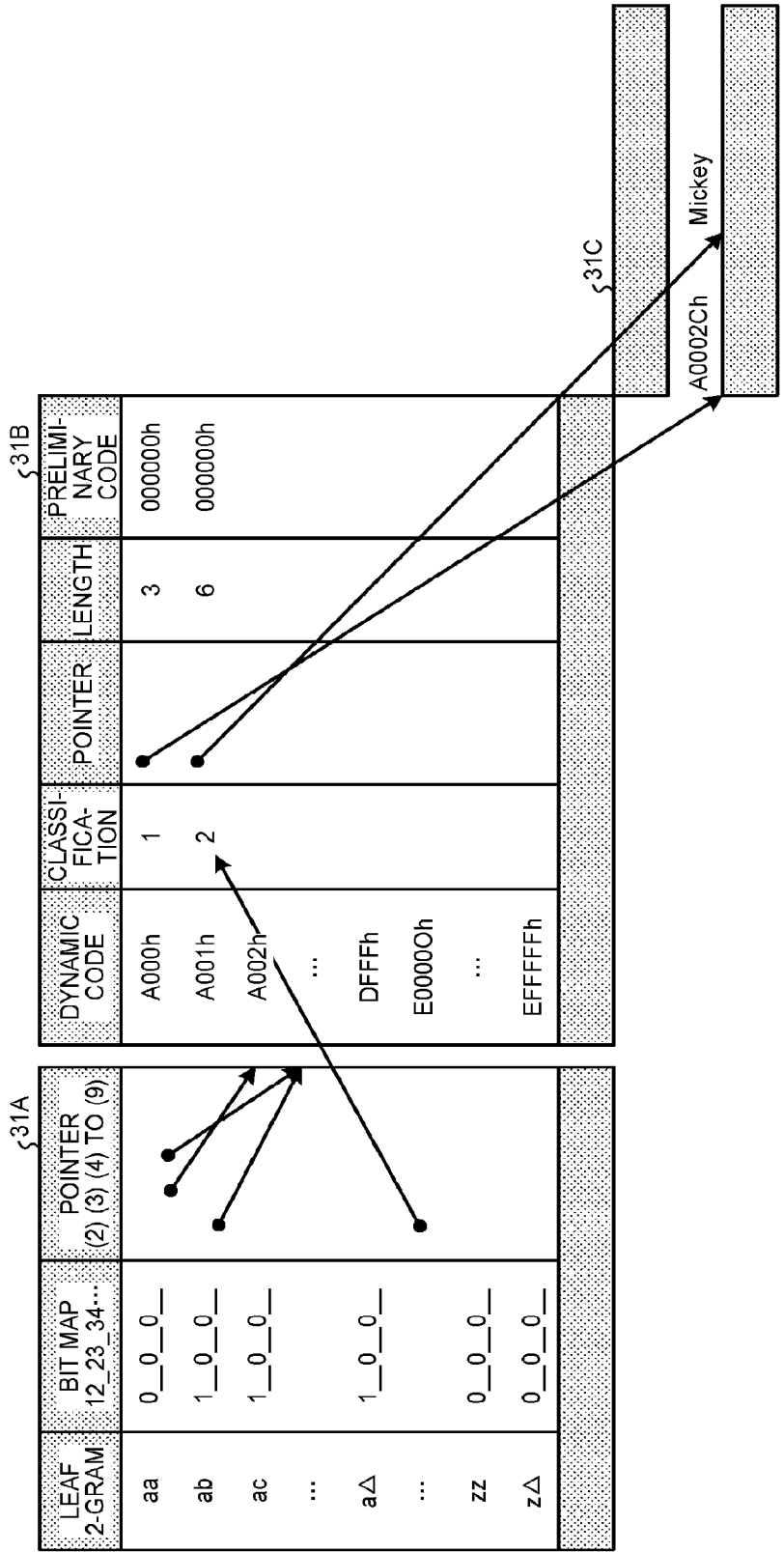
FIG. 7B is a diagram illustrating an example of a state in which a compressed code dynamically assigned to an unknown word is registered in the dynamic dictionary.

FIG. 7B is a diagram illustrating an example of a state in which the compressed code dynamically assigned to the unknown word is registered in the dynamic dictionary. FIG. 7B exemplifies a state in which the compressed code "A001h" dynamically assigned to the character string "Mickey" as the unknown word is registered. The character string "Mickey" is registered in the buffer part 31C. In the pointer part 31B, the assigned compressed code "A001h" is registered in the item of "dynamic code", the classification "2" is registered in the item of "classification", and the pointer indicating the position of the character string "Mickey" is registered in the item of "pointer". In the pointer part 31B, the length "6"-byte of the character string "Mickey" is registered in the item of "length", and the initial value "000000h" indicating that the preliminary code is not registered is registered in the item of "preliminary code". In the dynamic bit filter part 31A, the pointer toward the compressed code "A001h" is registered in the item of "pointer" of a record of the 2-gram character included in the character string "Mickey".

Returning to FIG. 3, the compression target file 32 is a file in which text data as a compression target is stored. The compressed file 33 is data obtained by performing compression processing on the compression target file 32.

The control unit 21 is a device that controls the terminal device 10. As the control unit 21, an electronic circuit such as a central processing unit (CPU) and a micro processing unit (MPU), and an integrated circuit such as an application specific integrated circuit (ASIC) and a field programmable gate array (FPGA) can be employed. The control unit 21 includes programs specifying various processing procedures and an internal memory for storing control data, and performs various types of processing using the programs and the internal memory. The control unit 21 functions as various processing units when various programs operate. For example, the control unit 21 includes the compression unit 40.

The compression unit 40 extracts a word from the compression target file 32, and generates the compressed file 33 in which the compressed code is associated with each word. The compression unit 40 includes an extraction unit 50, a determination unit 51, a replacement unit 52, and a generation unit 53.

The extraction unit 50 extracts the character string from the compression target file 32 in units of a word. For example, the extraction unit 50 sequentially reads out the character strings from the compression target file 32, and extracts words from the read character strings. For example, in a case in which words in a sentence are separated from each other with a certain delimiter such as a space like English, the extraction unit 50 reads out the character string from the compression target file 32, and separates the character string in units of a word with the delimiter in the character string to extract each word from the character string. For example, in a case in which words in a sentence are not separated from each other with a specific delimiter like Japanese, the extraction unit 50 reads out the character string from the compression target file 32. The extraction unit 50 performs natural language processing in accordance with a language of the sentence such as morphological analysis and syntactic analysis on the read character string to extract each word from the character string.

The determination unit 51 performs various determination processes on the word extracted by the extraction unit 50. For example, the determination unit 51 determines whether the extracted word is the high frequency word, the low frequency word, or the unknown word. For example, the determination unit 51 collates the extracted word with the static dictionary 34. As a result of collation, if the extracted word does not correspond to any word in the static dictionary 34, the determination unit 51 determines that the extracted word is an unknown word. That is, if the extracted word is not registered in the static dictionary 34, the determination unit 51 determines that the extracted word is an unknown word. As a result of collation, if the extracted word corresponds to any word in the static dictionary 34, the determination unit 51 acquires data of the items of "static code" and "dynamic code" of a corresponding record from the dictionary part 34B. If the compressed code is stored in the item of "static code", the determination unit 51 determines that the extracted word is the high frequency word. If the compressed code is not stored in the item of "static code", the determination unit 51 determines that the extracted word is the low frequency word. If the extracted word is the low frequency word, the determination unit 51 checks data of the item of "dynamic code". If the compressed code is stored in the item of "dynamic code", the determination unit 51 determines that the extracted word is the low frequency word that has already been registered in the dynamic dictionary 31. If the compressed code is not stored in the item of "dynamic code", the determination unit 51 determines that the extracted word is the low frequency word that is not registered in the dynamic dictionary 31.

The replacement unit 52 replaces the word extracted by the extraction unit 50 with the compressed code. For example, if the compressed code corresponding to the extracted word is registered in the static dictionary 34, the replacement unit 52 specifies the compressed code corresponding to the extracted word. For example, if the extracted word is the high frequency word, the replacement unit 52 specifies the compressed code stored in the item of "static code" as the compressed code corresponding to the word. If the extracted word is the low frequency word that has already been registered in the dynamic dictionary 31, the replacement unit 52 specifies the compressed code stored in the item of "dynamic code" as the compressed code corresponding to the extracted word. The replacement unit 52 then outputs the specified compressed code corresponding to the word to the generation unit 53.

If the extracted word is the unknown word, the replacement unit 52 collates the extracted word with the dynamic dictionary 31. The replacement unit 52 collates the dynamic bit filter part 31A of the dynamic dictionary 31 with the extracted unknown word to obtain a corresponding pointer, and determines whether the unknown word is registered. As a result of collation, if the extracted unknown word is registered in the dynamic dictionary 31, the determination unit 51 replaces the unknown word with the registered compressed code. For example, the replacement unit 52 specifies the compressed code stored in the item of "dynamic code" of the pointer part 31B as the compressed code corresponding to the unknown word. The replacement unit 52 outputs the specified compressed code corresponding to the unknown word to the generation unit 53.

If the extracted word is the unknown word not registered in the dynamic dictionary 31, or if the extracted word is the low frequency word not registered in the dynamic dictionary 31, the replacement unit 52 assigns a new compressed code to the extracted word. For example, the replacement unit 52 assigns the new compressed code to the extracted word in accordance with a predetermined assignment rule such as increasing the compressed code one bit by one bit in a predetermined range. In the present embodiment, the replacement unit 52 dynamically assigns a new 3-byte compressed code to the extracted word. The replacement unit 52 then replaces the extracted word with the assigned compressed code. For example, the replacement unit 52 outputs, to the generation unit 53, the compressed code that is assigned corresponding to the extracted word. The replacement unit 52 associates the extracted word, the dynamically assigned compressed code, and a region for the preliminary code with each other and stores them in the dynamic dictionary 31. For example, if the extracted word is the low frequency word not registered in the dynamic dictionary 31, the replacement unit 52 registers the basic code of the extracted word in the buffer part 31C as illustrated in FIG. 7A. The replacement unit 52 registers the assigned compressed code in the item of "dynamic code" of the pointer part 31B, registers "1" in the item of "classification", and registers the pointer indicating a position of the basic code stored in the buffer part 31C in the item of "pointer". The replacement unit 52 registers the length of the basic code in the item of "length" of the pointer part 31B, and registers the initial value "000000h" in the item of "preliminary code". The replacement unit 52 also registers the compressed code assigned to the item of "dynamic code" of the record of the extracted word in the static dictionary 34. If the extracted word is the unknown word not registered in the dynamic dictionary 31, the replacement unit 52 registers the character string of the extracted word in the buffer part 31C as illustrated in FIG. 7B. The replacement unit 52 registers the assigned compressed code in the item of "dynamic code" of the pointer part 31B, registers "2" in the item of "classification", and registers, in the item of "pointer", the pointer indicating the position of the character string of the word stored in the buffer part 31C. The replacement unit 52 registers, in the item of "length" of the pointer part 31B, the length of the character string of the word stored in the buffer part 31C, and registers the initial value "000000h" in the item of "preliminary code". The replacement unit 52 registers the pointer toward the assigned compressed code in the item of "pointer" of the record of the 2-gram character in the dynamic bit filter part 31A corresponding to the character string of the word stored in the buffer part 31C.

By using the compressed code replaced by the replacement unit 52, the generation unit 53 generates the compressed file 33 obtained by compressing the compression target file 32. For example, the generation unit 53 sequentially stores, in the compressed file 33, the compressed codes that are read out from the compression target file 32 in units of a word and output from the replacement unit 52, and stores the dynamic dictionary 31 in the compressed file 33 after storing the compressed codes for all of the words and generates the compressed file 33.

Figure 8A:
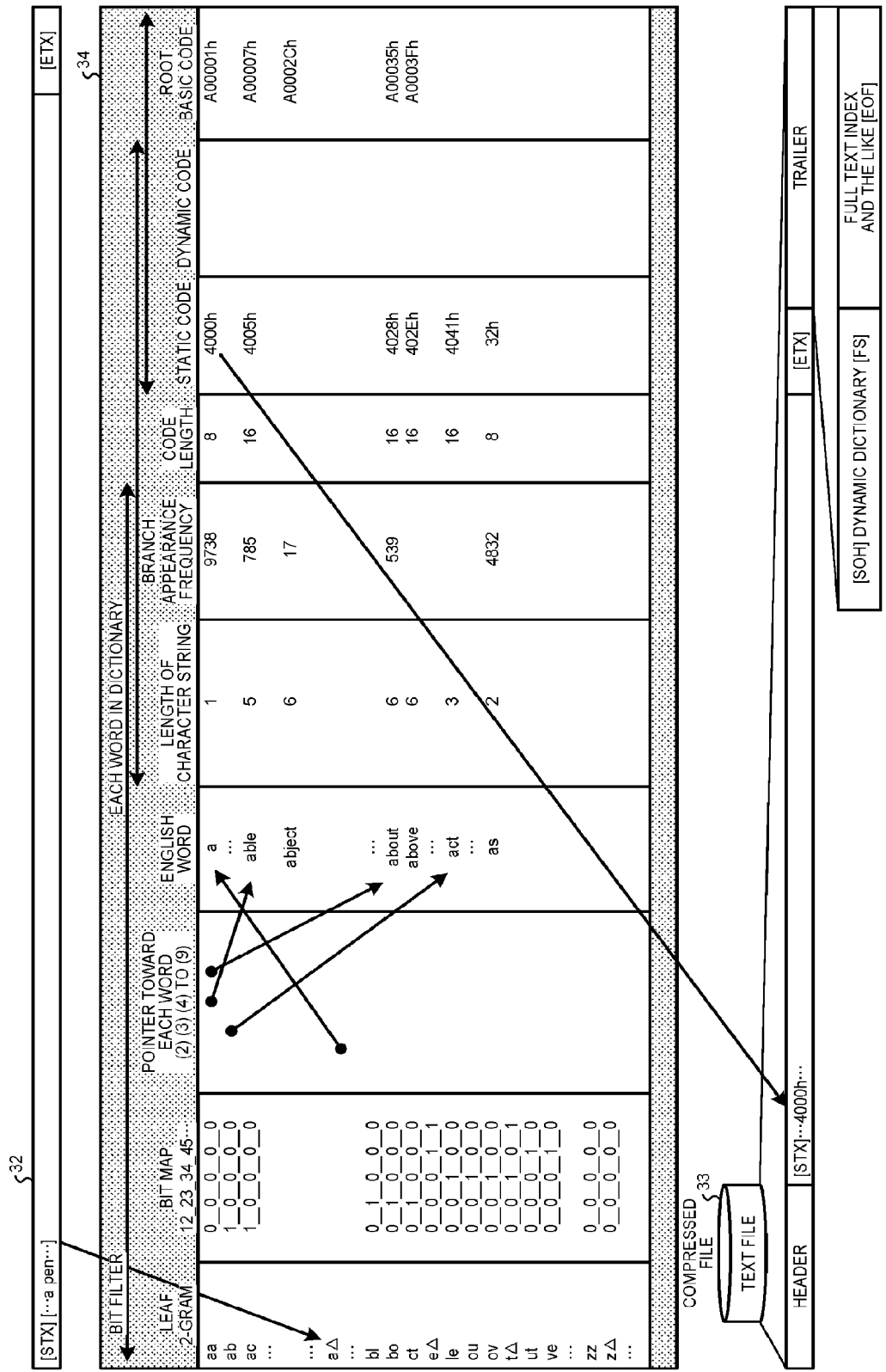
FIG. 8A is a diagram schematically illustrating a procedure for compressing a high frequency word.

The following describes a procedure for compressing the high frequency word, the low frequency word, and the unknown word. FIG. 8A is a diagram schematically illustrating the procedure for compressing the high frequency word. FIG. 8A exemplifies a case in which the extraction unit 50 extracts "a" from the compression target file 32. The determination unit 51 collates "a" with the static dictionary 34, and determines whether "a" is the high frequency word, the low frequency word, or the unknown word. The compressed code for "a" is registered in the item of "static code". Thus, "a" is determined to be the high frequency word. The replacement unit 52 replaces "a" with the compressed code "4000h" in the item of "static code". The generation unit 53 stores the compressed code "4000h" in the compressed file 33.

Figure 8B:
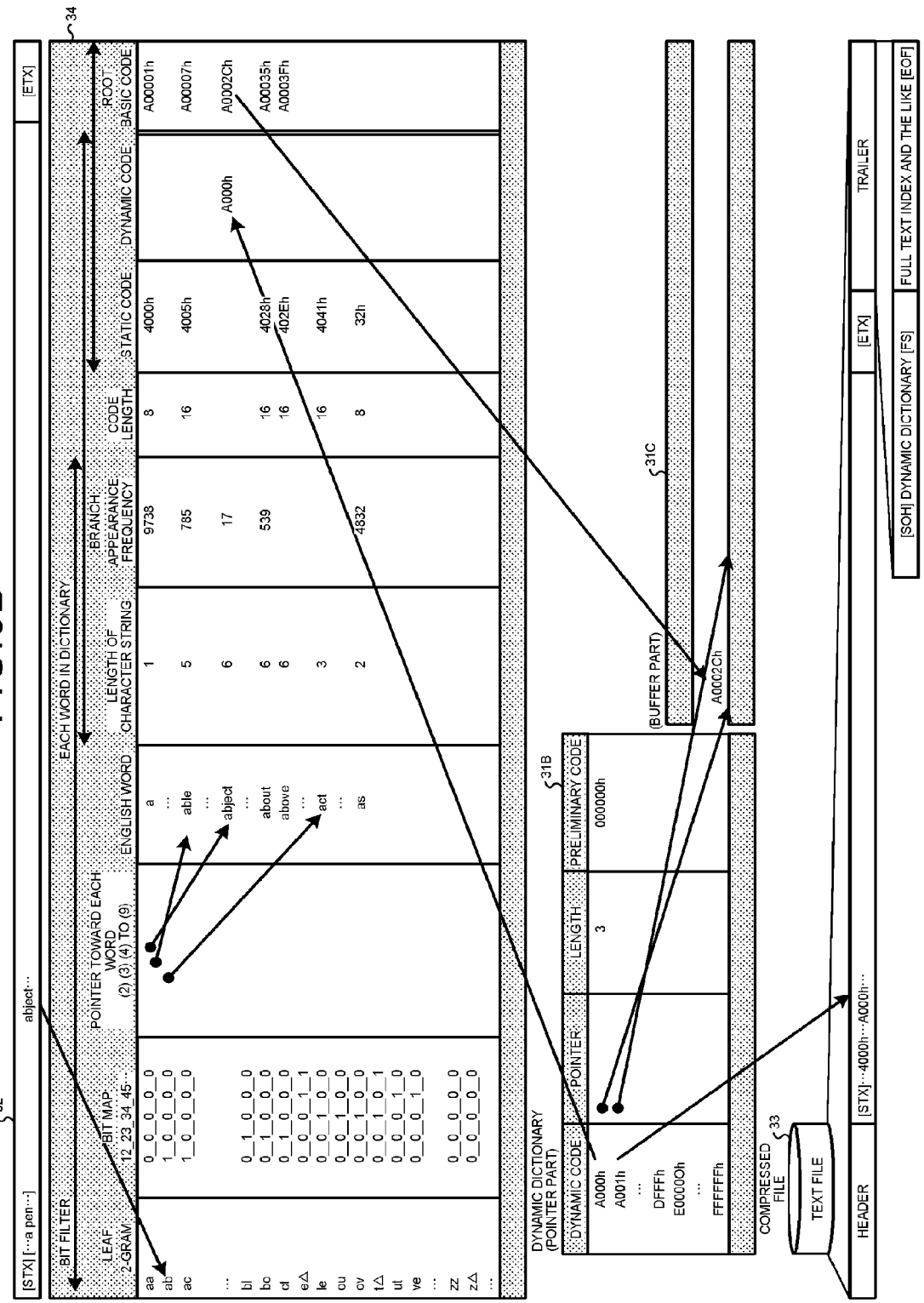
FIG. 8B is a diagram schematically illustrating a procedure for compressing the low frequency word.

FIG. 8B is a diagram schematically illustrating the procedure for compressing the low frequency word. FIG. 8B exemplifies a case in which the extraction unit 50 extracts "abject" from the compression target file 32. The determination unit 51 collates "abject" with the static dictionary 34, and determines whether "abject" is the high frequency word, the low frequency word, or the unknown word. No compressed code for "abject" is registered in the item of "static code", and no compressed code therefor is registered in the item of "dynamic code". Thus, "abject" is determined to be the low frequency word. The replacement unit 52 assigns a new compressed code "A000h" to "abject". The replacement unit 52 replaces "abject" with the assigned compressed code "A000h". The replacement unit 52 registers the basic code "A0002Ch" of "abject" in the buffer part 31C. The replacement unit 52 registers the assigned compressed code "A000h" in the item of "dynamic code" of the pointer part 31B, registers "1" in the item of "classification", and registers, in the item of "pointer", the pointer indicating the position of the basic code "A0002Chh" stored in the buffer part 31C. The replacement unit 52 registers the length of the basic code "A0002Ch" in the item of "length" of the pointer part 31B, and registers the initial value "000000h" in the item of "preliminary code". The replacement unit 52 registers the assigned compressed code "A000h" in the item of "dynamic code" of the record of "abject" in the static dictionary 34. The generation unit 53 stores the compressed code "A000h" in the compressed file 33. After this, the low frequency word registered in the dynamic dictionary 31 is replaced with the compressed code registered in the static dictionary 34 similarly to the high frequency word.

Figure 8C:
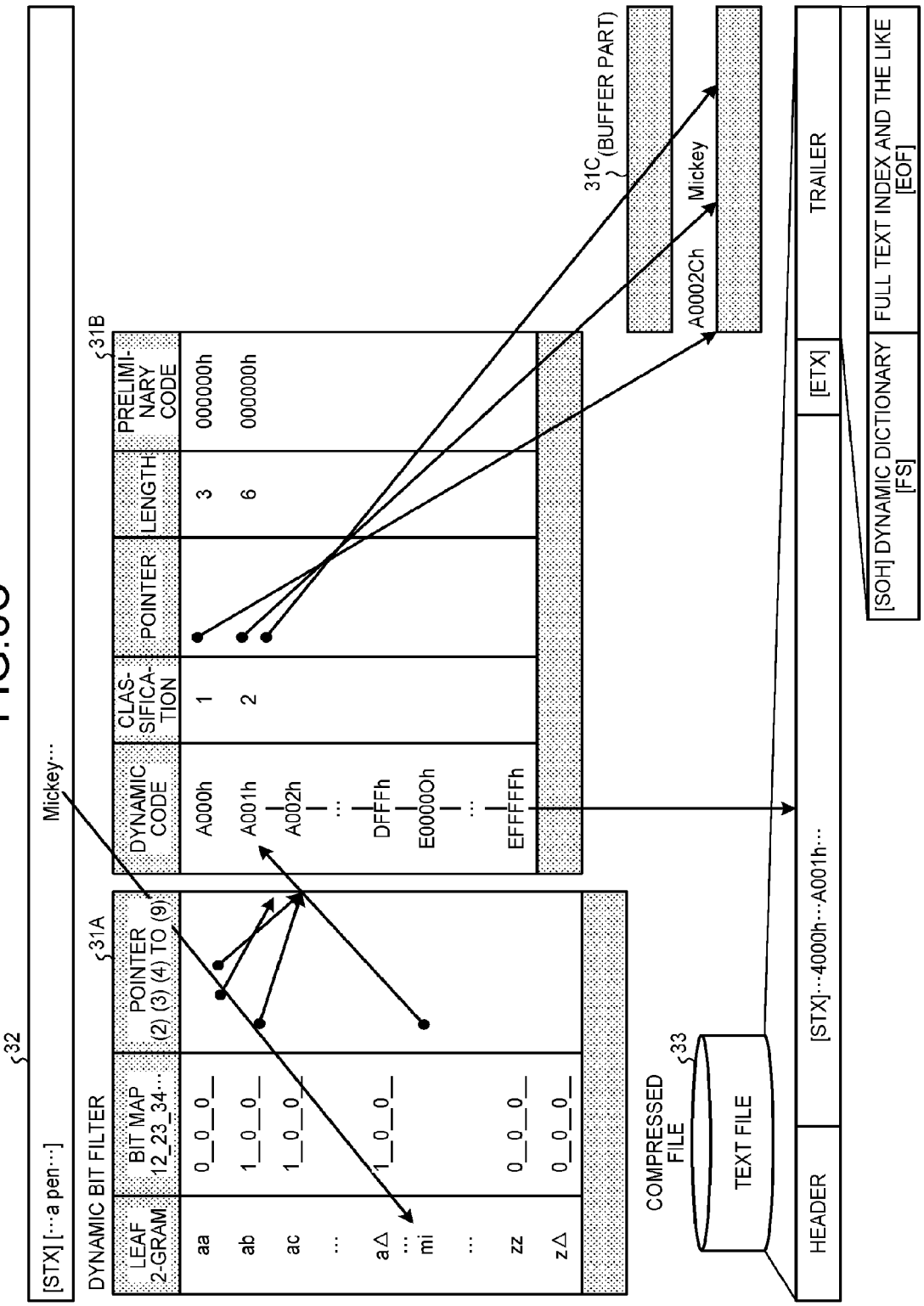
FIG. 8C is a diagram schematically illustrating a procedure for compressing the unknown word.

FIG. 8C is a diagram schematically illustrating the procedure for compressing the unknown word. FIG. 8C exemplifies a case in which the extraction unit 50 extracts "Mickey" from the compression target file 32. The determination unit 51 collates "Mickey" with the static dictionary 34, and determines whether "Mickey" is the high frequency word, the low frequency word, or the unknown word. "Mickey" is not registered in the static dictionary 34. Thus, "Mickey" is determined to be the unknown word. The replacement unit 52 assigns a new compressed code "A001h" to "Mickey". The replacement unit 52 replaces "Mickey" with the assigned compressed code "A001h". The replacement unit 52 registers "Mickey" in the buffer part 31C. The replacement unit 52 registers the assigned compressed code "A001h" in the item of "dynamic code" of the pointer part 31B, registers "2" in the item of "classification", and registers, in the item of "pointer", the pointer indicating the position of "Mickey" stored in the buffer part 31C. The replacement unit 52 registers the length of "Mickey" stored in the buffer part 31C in the item of "length" of the pointer part 31B, and registers the initial value "000000h" in the item of "preliminary code". The replacement unit 52 registers the pointer toward "A001h" in the item of "pointer" of the record of the 2-gram character in the dynamic bit filter part 31A corresponding to "Mickey". The generation unit 53 stores the compressed code "A001h" in the compressed file 33. After this, the unknown word registered in the dynamic dictionary 31 is replaced with the compressed code registered in the dynamic dictionary 31.

After storing the compressed codes for all of the words, the generation unit 53 stores the dynamic dictionary 31 in the trailer of the compressed file 33 and generates the compressed file 33. In FIGS. 8A to 8C, the dynamic dictionary 31 is stored in the trailer of the compressed file 33.

Figure 9:
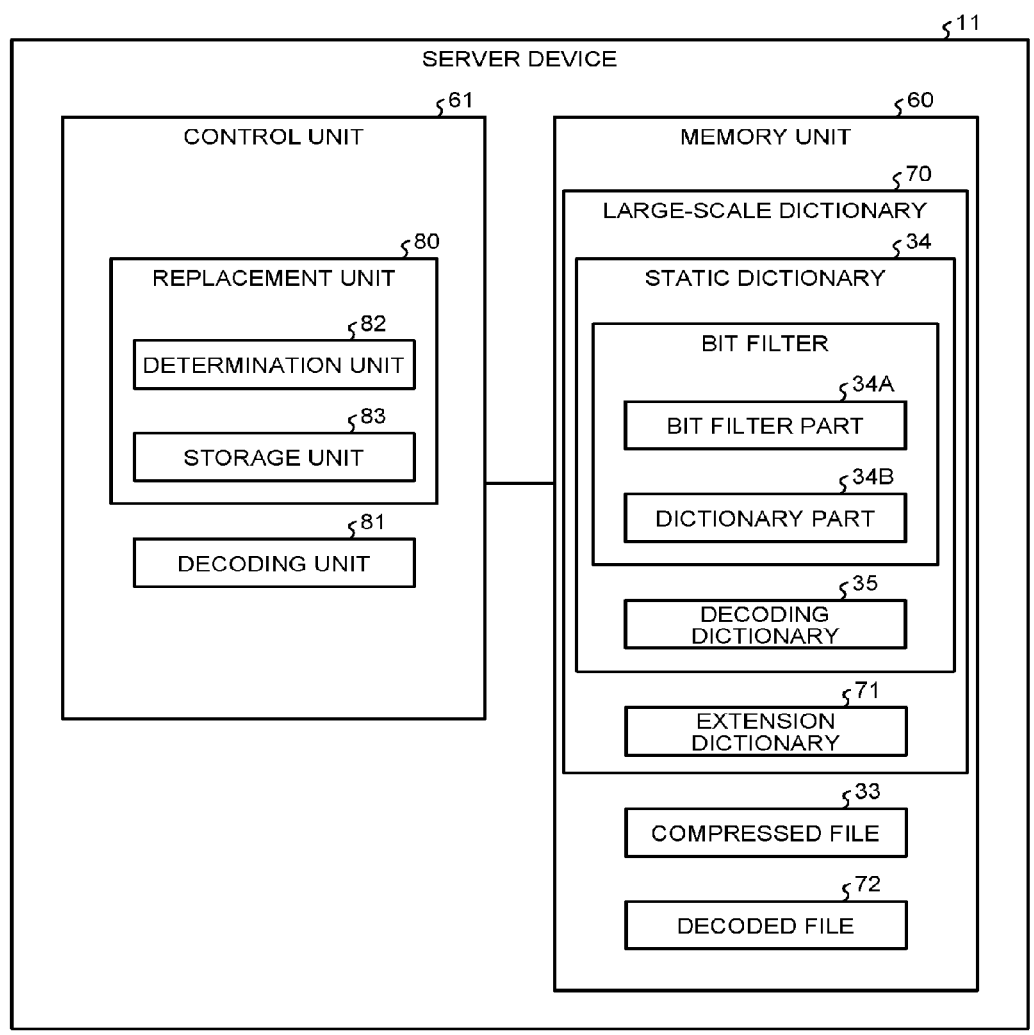
FIG. 9 is a diagram illustrating an example of a configuration of a server device.

The following describes a configuration of the server device 11. FIG. 9 is a diagram illustrating an example of the configuration of the server device. The server device 11 is a device that performs coding such as decoding of the compressed file 33. The server device 11 is, for example, an information processing device such as a personal computer and a server computer constituting a cloud system. As illustrated in FIG. 9, the server device 11 includes a memory unit 60 and a control unit 61. The server device 11 may include units other than the above-described units included in the information processing device.

The memory unit 60 is a storage device such as a hard disk, an SSD, and an optical disc. The memory unit 60 may be a data-rewritable semiconductor memory such as a RAM, a flash memory, and an NVSRAM.

The memory unit 60 stores an OS and various programs to be executed by the control unit 61. For example, the memory unit 60 stores various programs for performing replacement processing and decoding processing described later. The memory unit 60 further stores various pieces of data used in the program executed by the control unit 61. For example, the memory unit 60 stores the standard dictionary 30, an extension dictionary 71, the compressed file 33, and a decoded file 72.

The standard dictionary 30 is dictionary data used for compressing and decoding data. The standard dictionary 30 is the same as the standard dictionary 30 in the terminal device 10, so that the description thereof will not be repeated.

The extension dictionary 71 is dictionary data storing additional information of the basic word stored in the standard dictionary 30 and various pieces of information about a word other than the basic word stored in the standard dictionary 30. For example, in the extension dictionary 71, the compressed code and the basic code are defined for a new word other than the basic word, and various pieces of information such as a part of speech that can be utilized for data mining for each of the basic word and the new word are stored. The extension dictionary 71 may be one dictionary, or may include a plurality of dictionaries. In the present embodiment, the standard dictionary 30 and the extension dictionary 71 function as the large-scale dictionary 70. For example, as schematically illustrated in FIG. 2, the basic code is defined for a word, and a compressed code is registered for a high frequency word in the large-scale dictionary 70. The part of speech of each word is registered in the large-scale dictionary 70.

The compressed file 33 is data on which compression processing is performed by the terminal device 10. The decoded file 72 is data obtained by decoding the compressed file 33.

The control unit 61 is a device that controls the server device 11. As the control unit 61, an electronic circuit such as a CPU and an MPU, and an integrated circuit such as an ASIC and an FPGA can be employed. The control unit 61 includes programs specifying various processing procedures and an internal memory for storing control data, and performs various types of processing using the programs and the internal memory. The control unit 61 functions as various processing units when various programs operate. For example, the control unit 61 includes a replacement unit 80 and a decoding unit 81.

The replacement unit 80 performs replacement on the dynamic dictionary 31 stored in the trailer of the compressed file 33. The replacement unit 80 includes a determination unit 82 and a storage unit 83.

The determination unit 82 determines whether the word registered in the dynamic dictionary 31 that is stored in the trailer of the compressed file 33 is registered in the large-scale dictionary 70. For example, the determination unit 82 refers to the pointer part 31B, and reads out data corresponding to the length from the position in the buffer part 31C indicated by the pointer of classification "2". Thus, the character string of the unknown word registered in the dynamic dictionary 31 is read out. The determination unit 82 compares the character string of the read unknown word with the word registered in the large-scale dictionary 70, and determines whether the read unknown word is registered in the large-scale dictionary 70.

As a result of determination performed by the determination unit 82, if the character string of the unknown word is registered in the large-scale dictionary 70, the storage unit 83 stores, in the dynamic dictionary 31, a code registered in the large-scale dictionary 70 in accordance with the character string of the unknown word. For example, the storage unit 83 stores the basic code registered in the large-scale dictionary 70 in accordance with the character string of the unknown word, in the preliminary code of the pointer part 31B of the dynamic dictionary 31 stored in the trailer of the compressed file 33.

Accordingly, while keeping a state in which the compressed file 33 is compressed, the replacement unit 80 can associate the unknown word included in the compressed file 33 with the large-scale dictionary 70. Due to this, the server device 11 can perform various types of processing such as data mining on the compressed data compressed into the compressed file 33 including the unknown word, and can cause the compressed data compressed into the compressed file 33 to be utilized more effectively.

The decoding unit 81 decodes the compressed file 33. The decoding unit 81 sequentially reads out the compressed codes stored in the compressed file 33. The decoding unit 81 decodes the read compressed codes in order of words using the decoding dictionary 35 of the standard dictionary 30 and the dynamic dictionary 31 stored in the trailer of the compressed file 33.

Figure 10A:
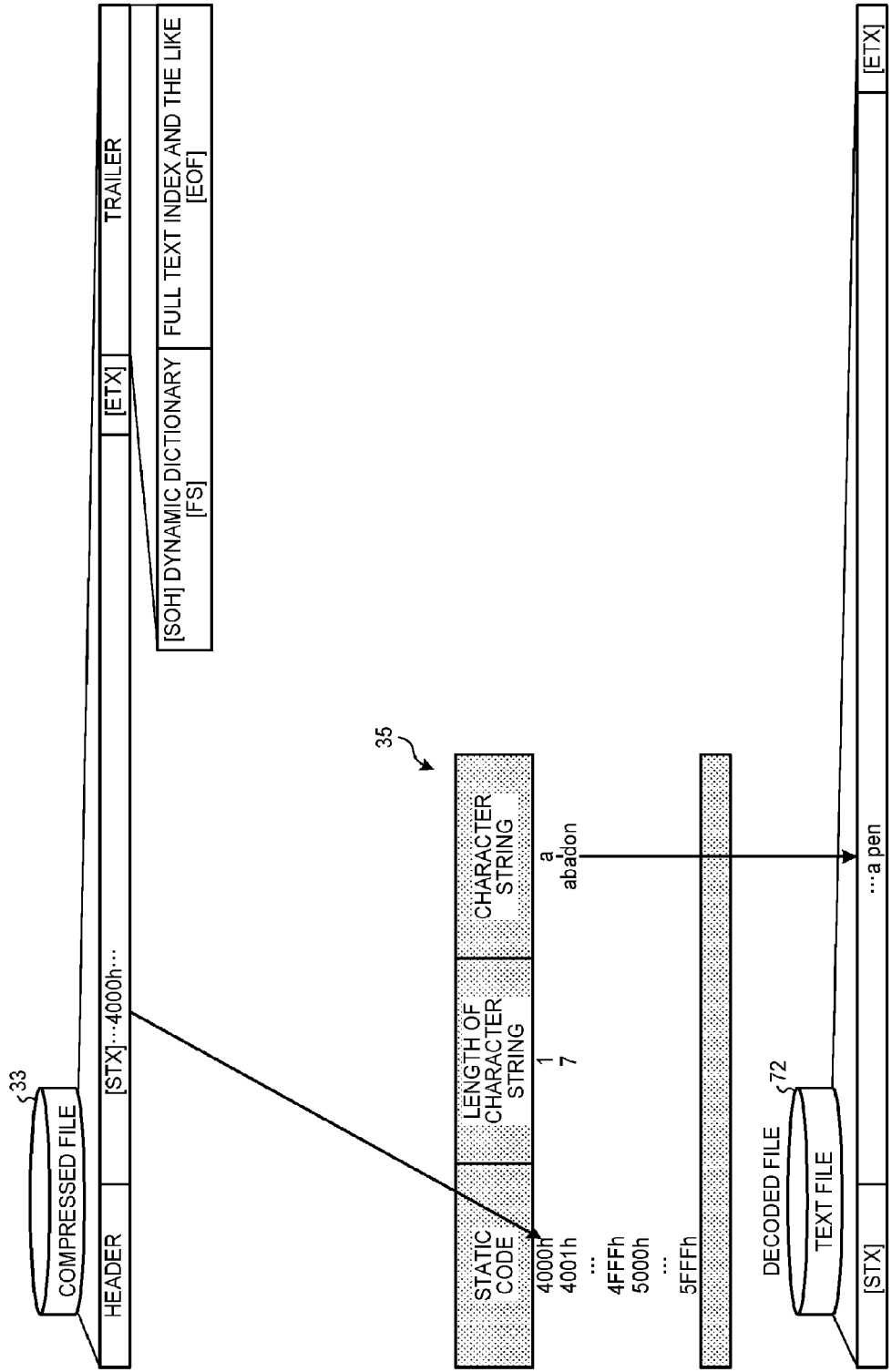
FIG. 10A is a diagram schematically illustrating a procedure for decoding the high frequency word.

The following describes a procedure for decoding the high frequency word, the low frequency word, and the unknown word. FIG. 10A is a diagram schematically illustrating the procedure for decoding the high frequency word. FIG. 10A exemplifies a case in which the decoding unit 81 reads out the compressed code "4000h" from the compressed file 33. The decoding unit 81 collates the compressed code "4000h" with the decoding dictionary 35, and stores the word "a" corresponding to "4000h" in the decoded file 72.

FIG. 10B is a diagram schematically illustrating the procedure for decoding the low frequency word. FIG. 10B exemplifies a case in which the decoding unit 81 reads out the compressed code "A000h" from the compressed file 33. The decoding unit 81 collates the compressed code "A000h" with the pointer part 31B, and reads out data corresponding to the length from the position in the buffer part 31C indicated by the pointer to acquire the basic code "A0002Ch" corresponding to the compressed code "A000h". The decoding unit 81 collates the basic code "A0002Ch" with the decoding dictionary 35, and stores the word "Abject" corresponding to "A0002Ch" in the decoded file 72.

Figure 10C:
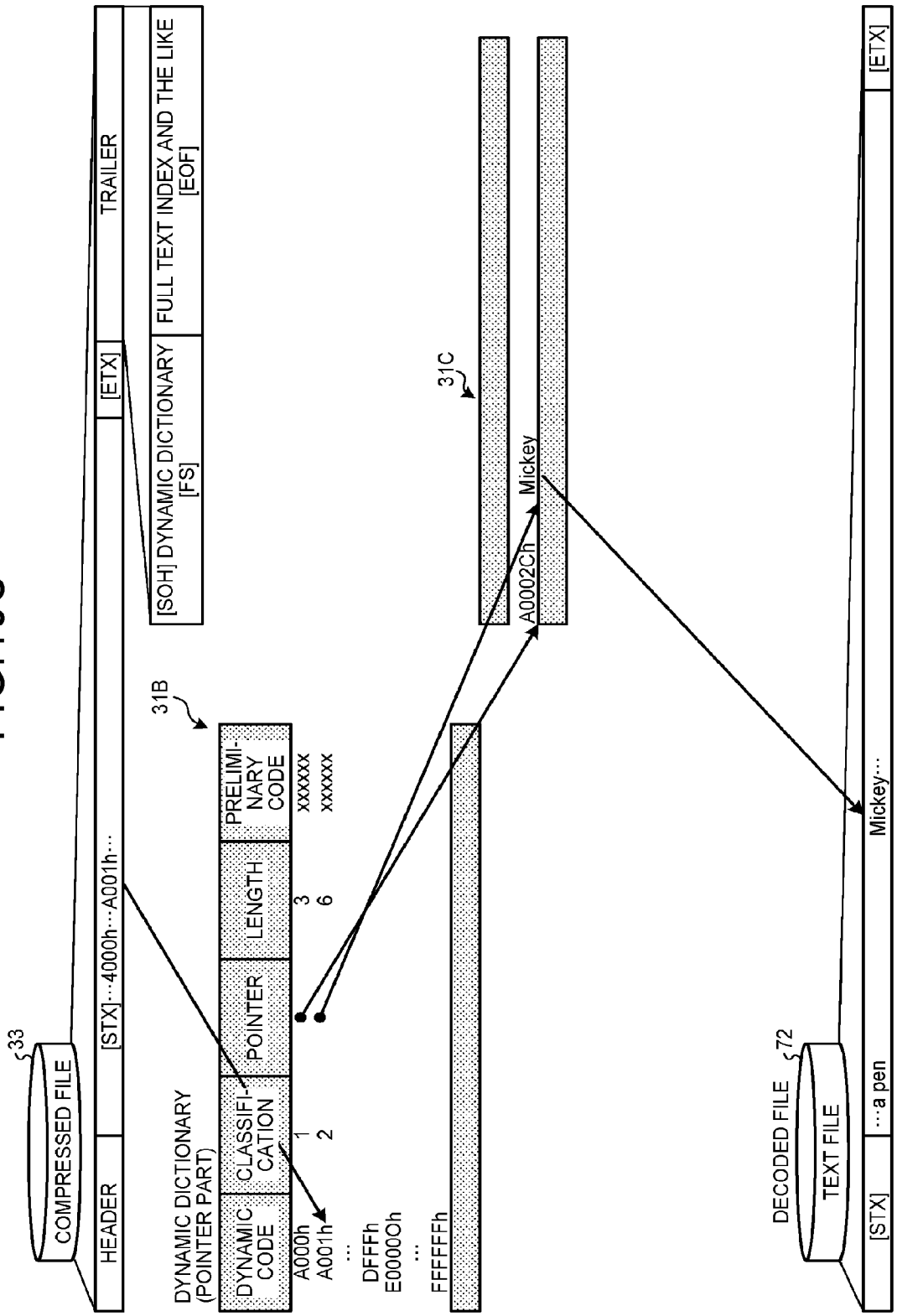
FIG. 10C is a diagram schematically illustrating a procedure for decoding the unknown word.

FIG. 10C is a diagram schematically illustrating the procedure for decoding an unknown word. FIG. 10C exemplifies a case in which the decoding unit 81 reads out the compressed code "A001h" from the compressed file 33. The decoding unit 81 collates the compressed code "A001h" with the pointer part 31B, and reads out data corresponding to the length from the position in the buffer part 31C indicated by the pointer to acquire the character string "Mickey". The decoding unit 81 then stores the character string "Mickey" in the decoded file 72.

Processing Procedure

Figure 11:
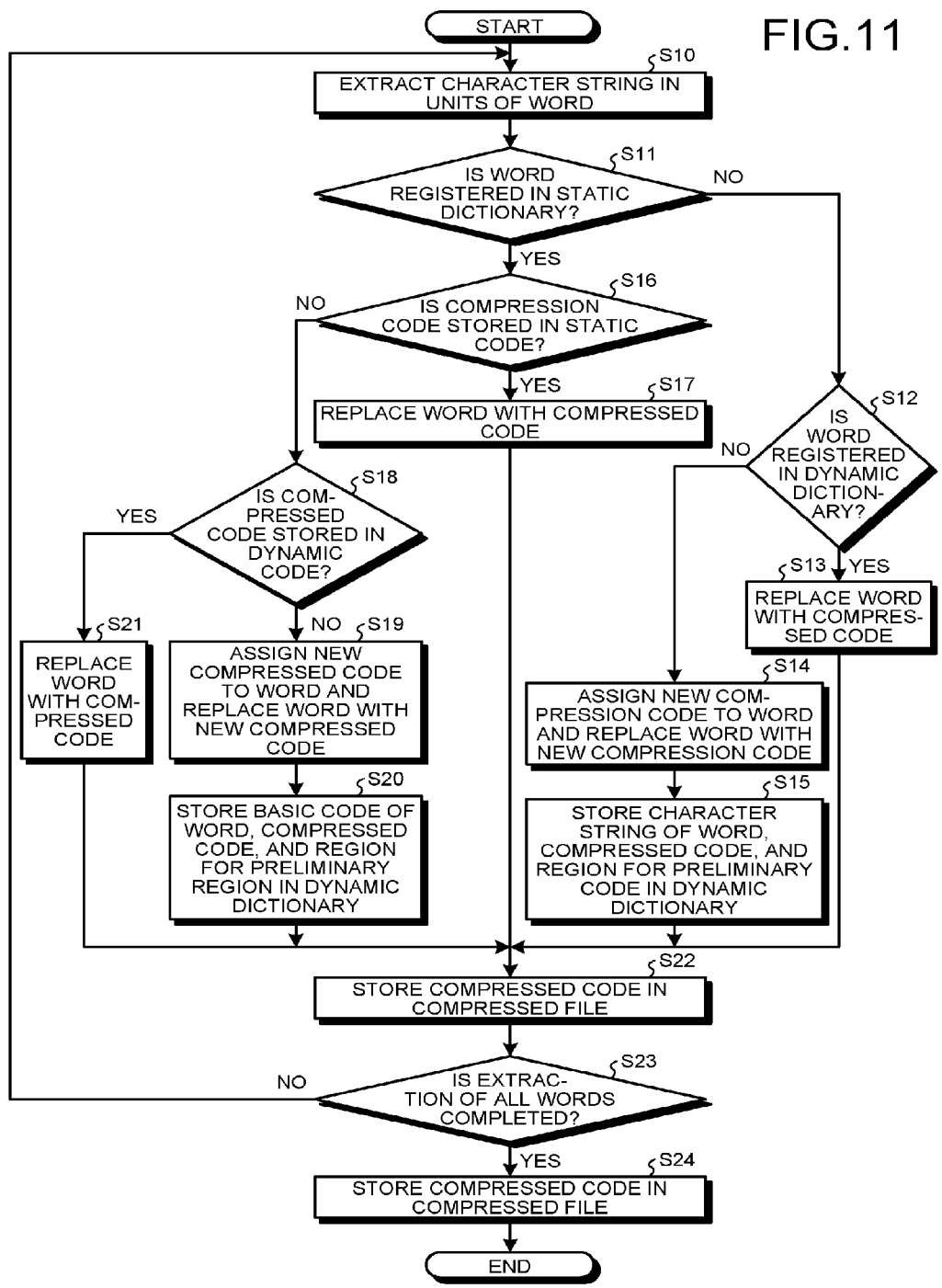
FIG. 11 is a flowchart illustrating an example of a process of compression processing.

The following describes a procedure of compression processing in which the terminal device 10 according to the present embodiment encodes and compresses the compression target file 32. FIG. 11 is a flowchart illustrating an example of a process of compression processing. The compression processing is performed at a predetermined timing, for example, a timing when a predetermined operation is performed for designating the compression target file 32 and instructing compression start.

As illustrated in FIG. 11, the extraction unit 50 extracts the character string from the compression target file 32 in units of a word (Step S10). The determination unit 51 collates the extracted word with the static dictionary 34, and determines whether the word is registered in the static dictionary 34 (Step S11). If the word is not registered (No at Step S11), the replacement unit 52 regards the extracted word as an unknown word, and determines whether the word is registered in the dynamic dictionary 31 (Step S12). If the extracted word is registered in the dynamic dictionary 31 (Yes at Step S12), the determination unit 51 replaces the extracted word with the compressed code registered in the dynamic dictionary 31 (Step S13).

If the unknown word is not registered in the dynamic dictionary 31 (No at Step S12), the replacement unit 52 regards the extracted word as the unknown word not registered in the dynamic dictionary 31, dynamically assigns a new 3-byte compressed code to the extracted word, and replaces the extracted word with the assigned compressed code (Step S14). The replacement unit 52 associates the character string of the extracted word, the dynamically assigned compressed code, and the region for the preliminary code with each other, and stores them in the dynamic dictionary 31 (Step S15).

If the word is registered (Yes at Step S11), the replacement unit 52 determines whether the compressed code is stored in the item of "static code" (Step S16). If the compressed code is stored in the item of "static code" (Yes at Step S16), the determination unit 51 regards the extracted word as the high frequency word, and replaces the extracted word with the compressed code stored in the item of "static code" (Step S17).

If the compressed code is not stored in the item of "static code" (No at Step S16), the determination unit 51 determines whether the compressed code is stored in the item of "dynamic code" (Step S18). If the compressed code is not stored in the item of "dynamic code" (No at Step S18), the determination unit 51 regards the extracted word as the low frequency word not registered in the dynamic dictionary 31, dynamically assigns a new 3-byte compressed code to the extracted word, and replaces the extracted word with the assigned compressed code (Step S19). The replacement unit 52 associates the basic code of the extracted word, the dynamically assigned compressed code, and the region for the preliminary code with each other, and stores them in the dynamic dictionary 31 (Step S20).

If the compressed code is stored in the item of "dynamic code" (Yes at Step S18), the determination unit 51 regards the extracted word as the low frequency word registered in the dynamic dictionary 31, and replaces the extracted word with the compressed code in the item of "dynamic code" (Step S21).

The generation unit 53 sequentially stores replaced compressed codes in the compressed file 33 (Step S22). The extraction unit 50 determines whether extraction of all the words in the text data from the compression target file 32 is completed (Step S23). If extraction of all of the words is not completed (No at Step S23), the process proceeds to Step S10 described above.

If extraction of all of the words is completed (Yes at Step S23), the generation unit 53 stores the dynamic dictionary 31 in the compressed file 33 (Step S24), and ends the process.

Figure 12:
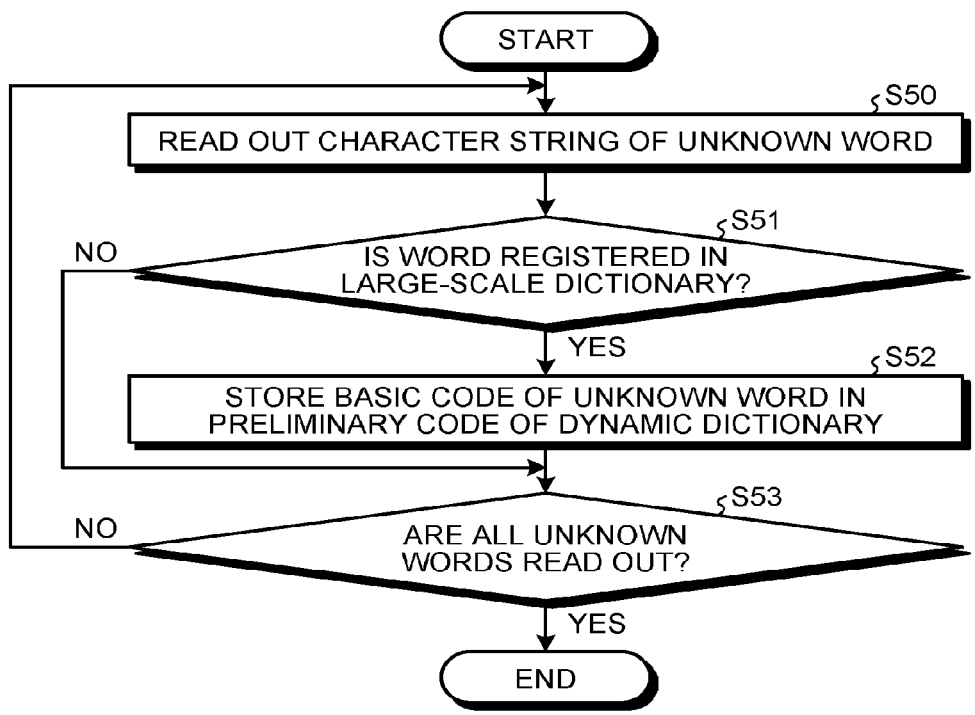
FIG. 12 is a flowchart illustrating an example of a process of replacement processing.

Next, the following describes a process of replacement processing in which the server device 11 according to the present embodiment performs replacement on the dynamic dictionary 31 stored in the trailer of the compressed file 33. FIG. 12 is a flowchart illustrating an example of the process of replacement processing. The replacement processing is performed at a predetermined timing, for example, a timing when the compression target file 32 is stored in the server device 11. The replacement processing may be performed at a timing when a predetermined operation is performed for designating the compressed file 33 and instructing replacement start. The replacement processing may also be performed at a timing corresponding to decoding processing, for example, before or after the decoding processing described later.

As illustrated in FIG. 12, the determination unit 82 refers to the pointer part 31B of the dynamic dictionary 31 stored in the trailer of the compressed file 33, and sequentially reads out the character string of the unknown word corresponding to the length from the position in the buffer part 31C indicated by the pointer of classification "2" (Step S50). The determination unit 82 compares the read character string of the unknown word with the word registered in the large-scale dictionary 70, and determines whether the read unknown word is registered in the large-scale dictionary 70 (Step S51). If the read character string of the unknown word is not registered in the large-scale dictionary 70 (No at Step S51), the process proceeds to Step S53 described later.

If the read character string of the unknown word is registered in the large-scale dictionary 70 (Yes at Step S51), the storage unit 83 stores, in the preliminary code of the pointer part 31B of the dynamic dictionary 31, the basic code registered in the large-scale dictionary 70 in accordance with the character string of the unknown word (Step S52).

The determination unit 82 determines whether all of the character strings of the unknown words stored in the dynamic dictionary 31 are read out (Step S53). If not all of the character strings are read out (No at Step S53), the process proceeds to Step S50 described above. If all of the character strings are read out (Yes at Step S53), the process is ended.

Figure 13:
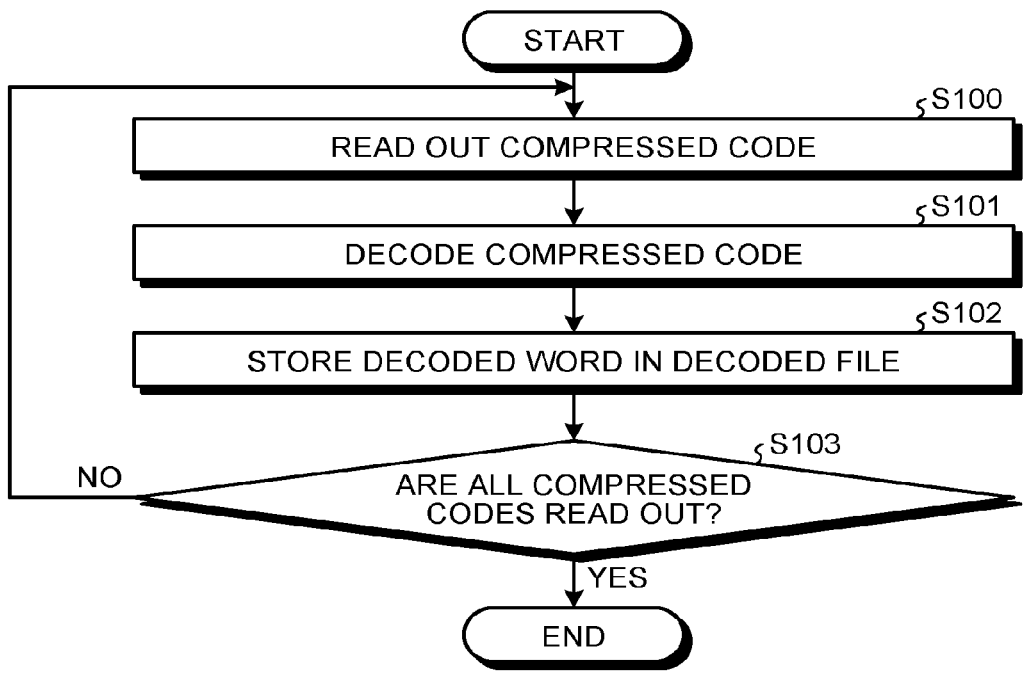
FIG. 13 is a flowchart illustrating an example of a process of decoding processing.

Next, the following describes a process of decoding processing in which the server device 11 according to the present embodiment decodes the compressed file 33. FIG. 13 is a flowchart illustrating an example of the process of decoding processing. The decoding processing is performed at a predetermined timing, for example, a timing when a predetermined operation is performed for designating the compressed file 33 and instructing decoding start.

As illustrated in FIG. 13, the decoding unit 81 sequentially reads out the compressed codes stored in the compressed file 33 (Step S100). The decoding unit 81 decodes the read compressed code in order of words using the decoding dictionary 35 of the standard dictionary 30 and the dynamic dictionary 31 stored in the trailer of the compressed file 33 (Step S101). The decoding unit 81 stores the decoded word in the decoded file 72 (Step S102). The decoding unit 81 determines whether all of the compressed codes stored in the compressed file 33 are read out (Step S103). If not all of the compressed codes are read out (No at Step S103), the process proceeds to Step S100 described above. If all of the compressed codes are read out (Yes at Step S103), the process is ended.

Advantageous Effects

As described above, the terminal device 10 according to the present embodiment replaces the character string in the compression target file 32 registered in the static dictionary 34 with the code corresponding to the character string. The terminal device 10 assigns a new compressed code to the character string in the compression target file 32 not registered in the static dictionary 34, associates the character string, the new compressed code, and the region for the preliminary code with each other and stores them in the dynamic dictionary 31, and replaces the character string with the new compressed code. The terminal device 10 generates the compressed file 33 including the replaced compressed code and the dynamic dictionary 31. Due to this, the terminal device 10 can store information to be associated with the character string and the compressed code in the region for the preliminary code in the dynamic dictionary 31 later, so that the compression target file 32 can be utilized more effectively.

The server device 11 according to the present embodiment determines whether the character string of the unknown word is registered in the large-scale dictionary 70, the character string of the unknown word being stored in the dynamic dictionary 31 of the compressed file 33 while being associated with the compressed code and the region for the preliminary code. If the character string is registered in the large-scale dictionary 70, the server device 11 stores, in the region for the preliminary code in the dynamic dictionary 31, the basic code corresponding to the character string of the unknown word in the large-scale dictionary 70. Accordingly, the server device 11 can associate the character string of the unknown word with the basic code of the large-scale dictionary 70 without decoding the compression target file 32.

[b] Second Embodiment

The embodiment of the disclosed device has been described above. However, the disclosed technique may be implemented in various different forms other than the embodiment described above. The following describes another embodiment encompassed by the present invention.

Figure 14:
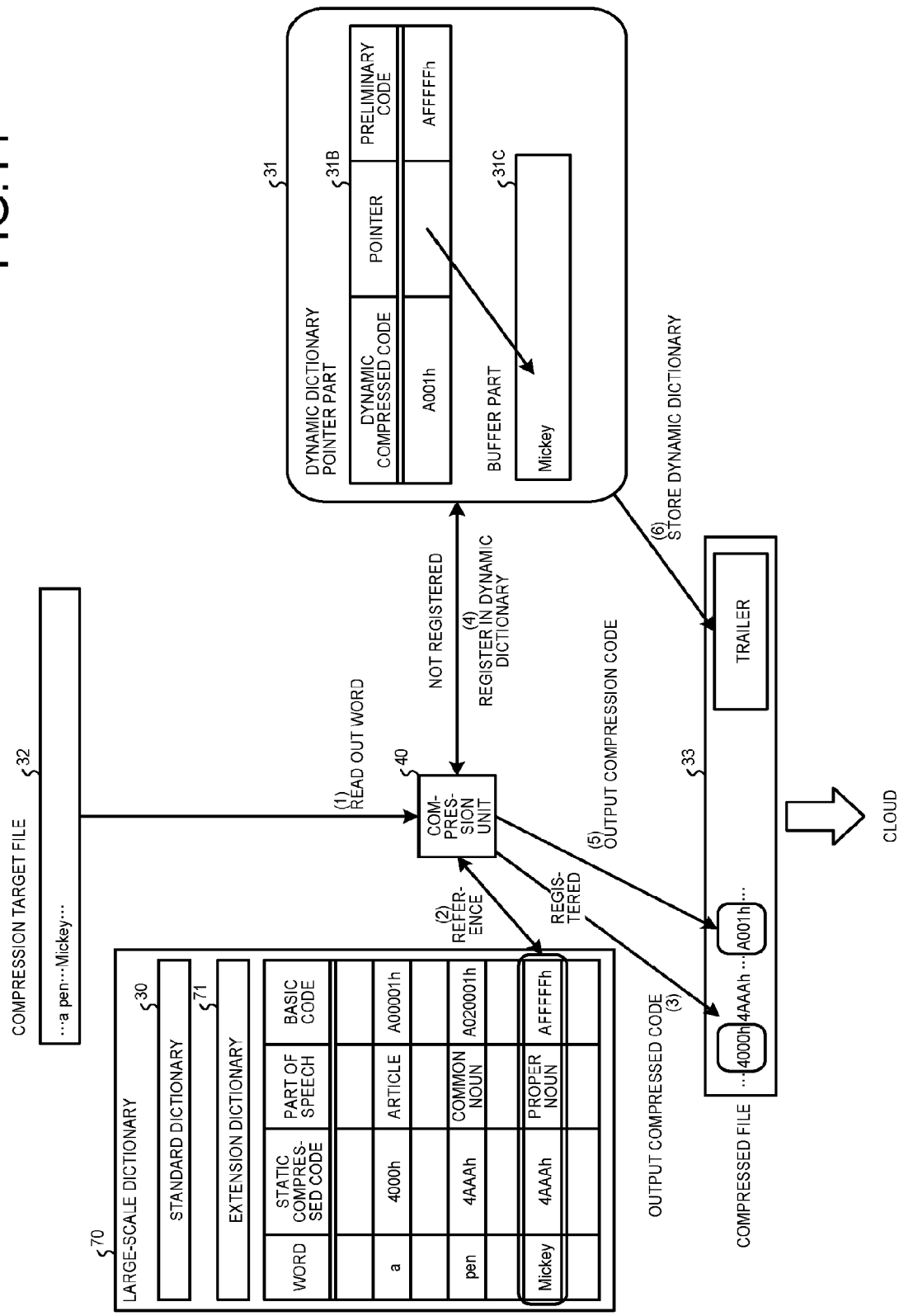
FIG. 14 is a diagram schematically illustrating the procedure of compression processing.

For example, in the above embodiment, regarding the character string of the unknown word not registered in the standard dictionary 30, "000000h" indicating that the preliminary code is not set is stored in the region of "preliminary code" of the pointer part 31B of the dynamic dictionary 31 in compression processing. However, the embodiment is not limited thereto. For example, in compression processing, when the information corresponding to the character string of the unregistered unknown word is registered in another dictionary even if the unknown word is not registered in the standard dictionary 30, the information corresponding to the character string of the unregistered unknown word may be stored in the region of "preliminary code" of the pointer part 31B of the dynamic dictionary 31. FIG. 14 is a diagram schematically illustrating the procedure of compression processing. FIG. 14 exemplifies a case in which the server device 11 compresses " . . . a pen . . . Mickey . . . " included in the compression target file 32. The word "Mickey" is not registered in the standard dictionary 30, but the basic code thereof is registered in the extension dictionary 71. Thus, the basic code "AFFFFFh" is registered in the large-scale dictionary 70 corresponding to "Mickey". The server device 11 compresses "Mickey" as the character string of the unknown word not registered in the standard dictionary 30 so as to enable decoding by the terminal device 10 including only the standard dictionary 30. However, if the character string not registered in the standard dictionary 30 is registered in another dictionary included in the server device 11, the server device 11 stores, in the region of "preliminary code", the code corresponding to the unregistered character string in the other dictionary. For example, the server device 11 stores the basic code "AFFFFFh" in the region of "preliminary code" of the pointer part 31B of the dynamic dictionary 31. The server device 11 may store, in the region of "preliminary code" of the pointer part 31B of the dynamic dictionary 31, information related to the unregistered character string such as the compressed code in the large-scale dictionary 70 or information indicating the part of speech in addition to the basic code. Accordingly, the server device 11 can compress the compression target file 32 using the information of the large-scale dictionary 70, and can perform various types of processing such as data mining while keeping a state in which the compressed file 33 is compressed including the character string not registered in the standard dictionary 30. The compressed file 33 can also be decoded by the terminal device 10 including only the standard dictionary 30 because the character string not registered in the standard dictionary 30 is registered in the dynamic dictionary 31.

In the above embodiment, the compressed file 33 stores the dynamic dictionary 31 including the region of "preliminary code" of the pointer part 31B in compression processing. However, the embodiment is not limited thereto. In compression processing, the dynamic dictionary 31 may be stored in the compressed file 33 without providing the region of "preliminary code" to the pointer part 31B, and the region of "preliminary code" may be added to the pointer part 31B of the dynamic dictionary 31 in the compressed file 33 later. For example, the terminal device 10 stores the dynamic dictionary 31 in the compressed file 33 without providing the region of "preliminary code" to the pointer part 31B. The server device 11 checks whether there is the region of "preliminary code" in the pointer part 31B of the dynamic dictionary 31 in the compressed file 33 at a predetermined timing such as a timing when the compressed file 33 is received or a timing for decoding. If the region of "preliminary code" is not included in the pointer part 31B of the dynamic dictionary 31 in the compressed file 33, the server device 11 may add the region of "preliminary code" to the pointer part 31B.

The components of the devices illustrated in the drawings are merely conceptual, and it is not required that it is physically configured as illustrated necessarily. That is, specific forms of distribution and integration of the devices are not limited to those illustrated in the drawings. All or part thereof may be functionally or physically distributed/integrated in optional units depending on various loads or usage states. For example, the processing units, namely, the extraction unit 50, the determination unit 51, the replacement unit 52, and the generation unit 53 of the terminal device 10 may be appropriately integrated. The processing units, namely, the replacement unit 80 (the determination unit 82, the storage unit 83) and the decoding unit 81 of the server device 11 may be appropriately integrated. The processing performed by each of the processing units of the terminal device 10 and the server device 11 may be appropriately separated into pieces of processing performed by a plurality of processing units. All or any part of processing functions executed by the processing units may be implemented by a CPU and a computer program to be analyzed and executed by the CPU, or may be implemented as hardware based on wired logic.

Compression Program

Figure 15:
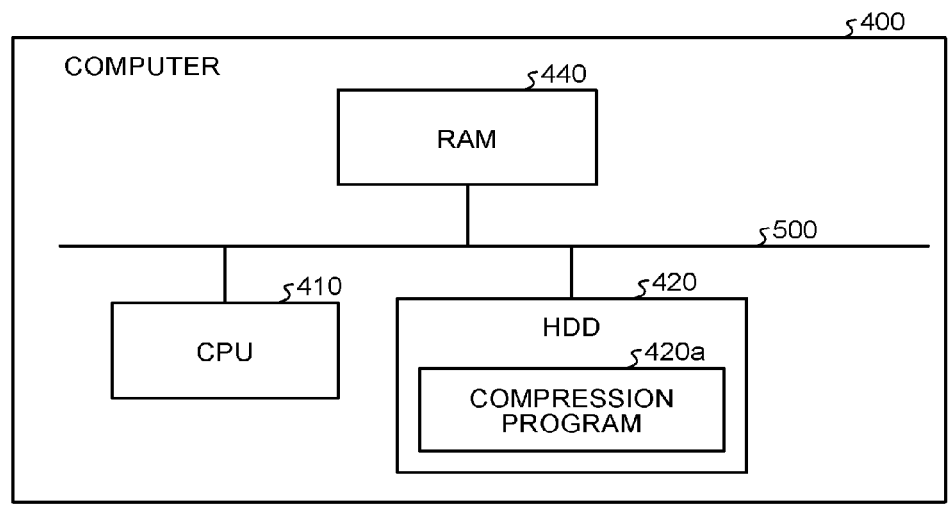
FIG. 15 is a diagram illustrating an example of a computer that executes a compression program.

The various types of processing described in the above embodiments can also be performed by executing a computer program prepared in advance with a computer system such as a personal computer and a workstation. The following describes an example of a computer system that executes a computer program having the same function as that in the above embodiments. First, the following describes a compression program for performing compression processing. FIG. 15 is a diagram illustrating an example of a computer that executes the compression program.

As illustrated in FIG. 15, a computer 400 includes a central processing unit (CPU) 410, a hard disk drive (HDD) 420, and a random access memory (RAM) 440. These components 400 to 440 are connected to each other via a bus 500.

The HDD 420 includes a compression program 420a stored therein that exhibits a function similar to the extraction unit 50, the determination unit 51, the replacement unit 52, and the generation unit 53 in the terminal device 10. The compression program 420a may be appropriately divided into a plurality of parts.

The HDD 420 stores various pieces of information. For example, the HDD 420 stores an OS and various pieces of data used for compression.

When the CPU 410 reads out the compression program 420a from the HDD 420 and executes it, the same operation as that of each processing unit according to the embodiments is performed. That is, the compression program 420a performs the same operation as that of the extraction unit 50, the determination unit 51, the replacement unit 52, and the generation unit 53.

The compression program 420a is not necessarily stored in the HDD 420 from the beginning.

Replacement Program

Figure 16:
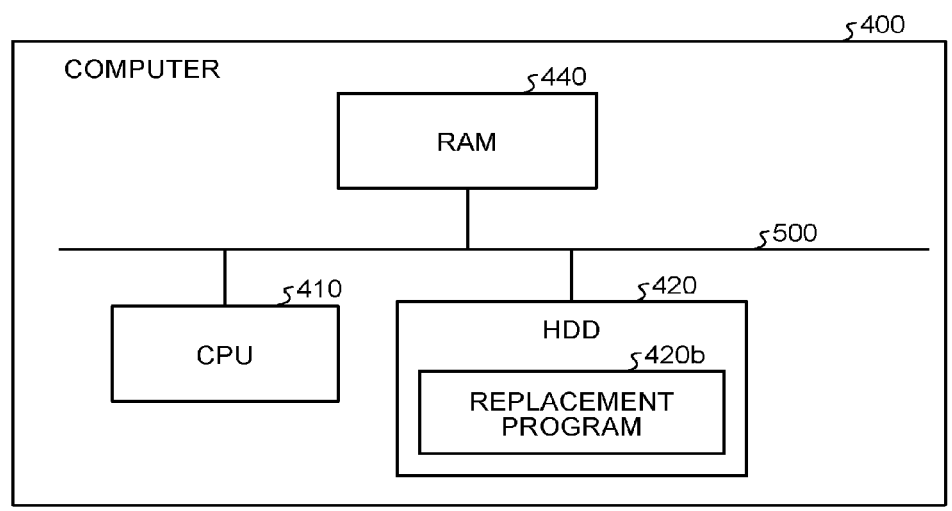
FIG. 16 is a diagram illustrating a computer that executes a replacement program.

The following describes a replacement program that performs replacement on the dynamic dictionary 31 stored in the trailer of the compressed file 33. FIG. 16 is a diagram illustrating an example of a computer that executes the replacement program. The same component as that in FIG. 15 is denoted by the same reference numeral, and the description thereof will not be repeated.

As illustrated in FIG. 16, the HDD 420 includes a replacement program 420b stored therein that exhibits a function similar to the replacement unit 80 (the determination unit 82, the storage unit 83) of the server device 11. The replacement program 420b may be appropriately divided into a plurality of parts. The replacement program 420b may be a decoding program having the function of the decoding unit 81.

The HDD 420 stores various pieces of information. For example, the HDD 420 stores an OS and various pieces of data used for replacement.

When the CPU 410 reads out the replacement program 420b from the HDD 420 and executes it, the same operation as that of each processing unit according to the embodiments is performed. That is, the replacement program 420b performs the same operation as that of the replacement unit 80.

The replacement program 420b is not necessarily stored in the HDD 420 from the beginning.

For example, the compression program 420a and the replacement program 420b may be stored in a "portable physical medium" such as a flexible disk (FD), a CD-ROM, a DVD disc, a magneto-optical disc, and an IC card to be inserted into the computer 400. The computer 400 may read out the program from such a medium and execute the program.

Alternatively, the program may be stored in "another computer (or a server)" connected to the computer 400 via a public network, the Internet, a LAN, and a WAN. The computer 400 may read out the program from such a computer and execute the program.

According to an aspect of the invention, compressed data can be utilized more effectively.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium having stored therein a replacement program that causes a first computer to execute a process comprising:
   receiving an encoded data that is encoded in a second computer with a first dictionary and a dynamic dictionary, the encoded data including a plurality of first codes, a plurality of second codes, and the dynamic dictionary, the plurality of first codes being associated with a plurality of first character strings in the first dictionary, respectively,
   the plurality of second codes being associated with a plurality of second character strings, respectively, that are not registered in the first dictionary, each of the plurality of second codes being associated with a corresponding second character string and a preliminary code region in the dynamic dictionary;
   determining whether each of the plurality of second character strings is registered in a second dictionary included in the first computer; and
   storing a specific second code to a corresponding preliminary code region in the dynamic dictionary, when a specific second character string in the plurality of second characters is registered in the second dictionary, the specific second code corresponding to the specific second character string.

2. A replacement method, executed by a first computer, comprising:
   receiving an encoded data that is encoded in a second computer with a first dictionary and a dynamic dictionary, the encoded data including a plurality of first codes, a plurality of second codes, and the dynamic dictionary, the plurality of first codes being associated with a plurality of first character strings in the first dictionary, respectively, the plurality of second codes being associated with a plurality of second character strings, respectively, that are not registered in the first dictionary, each of the plurality of second codes being associated with a corresponding second character string and a preliminary code region in the dynamic dictionary;
   determining whether each of the plurality of second character strings is registered in a second dictionary included in the first computer; and
   storing a specific second code to a corresponding preliminary code region in the dynamic dictionary, when a specific second character string in the plurality of second characters is registered in the second dictionary, the specific second code corresponding to the specific second character string.

3. An information processing device comprising:
   a memory; and
   a processor coupled to the memory, the processor executing a process comprising:
   receiving an encoded data that is encoded in a computer with a first dictionary and a dynamic dictionary, the encoded data including a plurality of first codes, a plurality of second codes, and the dynamic dictionary, the plurality of first codes being associated with a plurality of first character strings in the first dictionary, respectively, the plurality of second codes being associated with a plurality of second character strings, respectively, that are not registered in the first dictionary, each of the plurality of second codes being associated with a corresponding second character string and a preliminary code region in the dynamic dictionary;

determining whether each of the plurality of second character strings is registered in a second dictionary included in the information processing device and storing a specific second code to a corresponding preliminary code region in the dynamic dictionary, when a specific second character string in the plurality of second characters is registered in the second dictionary, the specific second code corresponding to the specific second character string.

* * * * *